United States Patent
Wang et al.

(10) Patent No.: US 11,869,897 B2
(45) Date of Patent: Jan. 9, 2024

(54) ARRAY SUBSTRATE, DISPLAY APPARATUS, AND METHOD OF FABRICATING ARRAY SUBSTRATE

(71) Applicant: BOE Technology Group Co., Ltd., Beijing (CN)

(72) Inventors: Ke Wang, Beijing (CN); Muxin Di, Beijing (CN); Zhiwei Liang, Beijing (CN); Guoqiang Wang, Beijing (CN); Renquan Gu, Beijing (CN); Xiaoxin Song, Beijing (CN); Xiaoyan Zhu, Beijing (CN); Yingwei Liu, Beijing (CN); Zhanfeng Cao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 666 days.

(21) Appl. No.: 17/057,546

(22) PCT Filed: Mar. 24, 2020

(86) PCT No.: PCT/CN2020/080810
§ 371 (c)(1),
(2) Date: Nov. 20, 2020

(87) PCT Pub. No.: WO2021/189230
PCT Pub. Date: Sep. 30, 2021

(65) Prior Publication Data
US 2022/0199650 A1 Jun. 23, 2022

(51) Int. Cl.
*H01L 27/12* (2006.01)
(52) U.S. Cl.
CPC .......... *H01L 27/124* (2013.01); *H01L 27/127* (2013.01); *H01L 27/1251* (2013.01)
(58) Field of Classification Search
CPC .. H01L 27/124; H01L 27/1251; H01L 27/127
(Continued)

(56) References Cited

U.S. PATENT DOCUMENTS

2008/0049157 A1* 2/2008 Kim ................. G02F 1/136227
438/30
2008/0169470 A1 7/2008 Lim et al.
(Continued)

FOREIGN PATENT DOCUMENTS

| JP | 2009282366 A | 12/2009 |
| JP | 2015072361 A | 4/2015 |

OTHER PUBLICATIONS

International Search Report & Written Opinion dated Nov. 6, 2020, regarding PCT/CN2020/080810.
(Continued)

*Primary Examiner* — Jami Valentine Miller
(74) *Attorney, Agent, or Firm* — Intellectual Valley Law, P.C.

(57) ABSTRACT

An array substrate including a display area having a plurality of subpixels is provided. The plurality of subpixels includes a plurality of first subpixels in a display-bonding sub-area and a plurality of second subpixels in a regular display sub-area. The array substrate includes a plurality of thin film transistors on a first side of the base substrate and respectively in the plurality of subpixels. A respective one of the plurality of first subpixels includes a bonding pad on a second side of a base substrate; a lead line electrically connecting a respective one of a plurality of thin film transistors to the bonding pad; and a via extending through the base substrate. The lead line is unexposed in the array substrate. The lead line extends from the first side to the second side of the base substrate through the via, to connect to the bonding pad.

20 Claims, 23 Drawing Sheets

(58) Field of Classification Search
USPC .......................................................... 257/59
See application file for complete search history.

(56) References Cited

U.S. PATENT DOCUMENTS

| | | |
|---|---|---|
| 2017/0338246 A1 | 11/2017 | Kubota et al. |
| 2018/0182839 A1* | 6/2018 | Lee .......................... H01L 23/52 |
| 2019/0067332 A1 | 2/2019 | Liu et al. |
| 2020/0185483 A1* | 6/2020 | Peng .................. G01R 31/2884 |
| 2021/0109412 A1* | 4/2021 | Suzumura ............. G02F 1/1368 |
| 2022/0005913 A1* | 1/2022 | Xiao .................. H10K 59/1216 |

OTHER PUBLICATIONS

Extended European Search Report in the European Patent Application No. 20927405.9, dated Jun. 2, 2021.

* cited by examiner

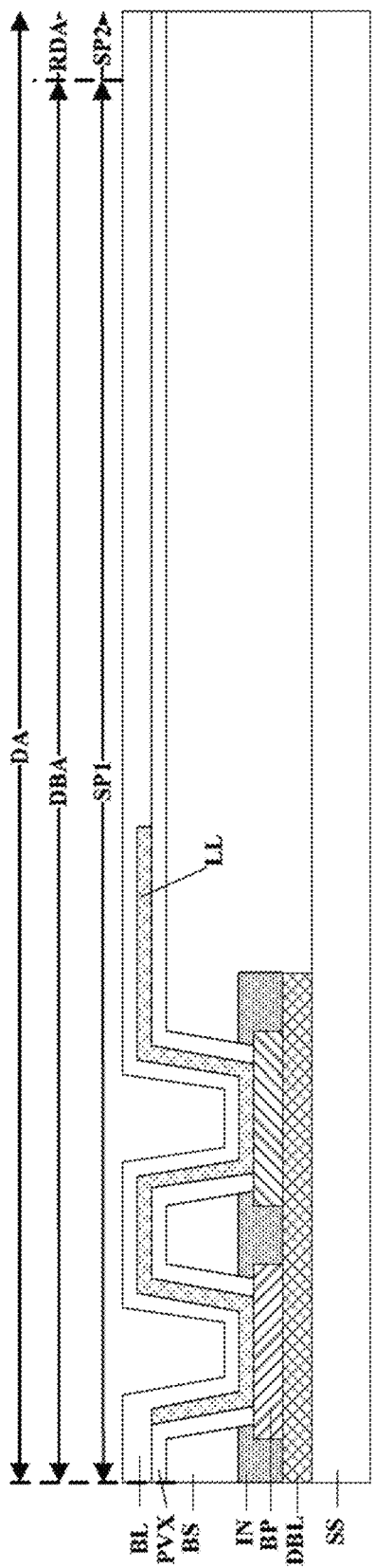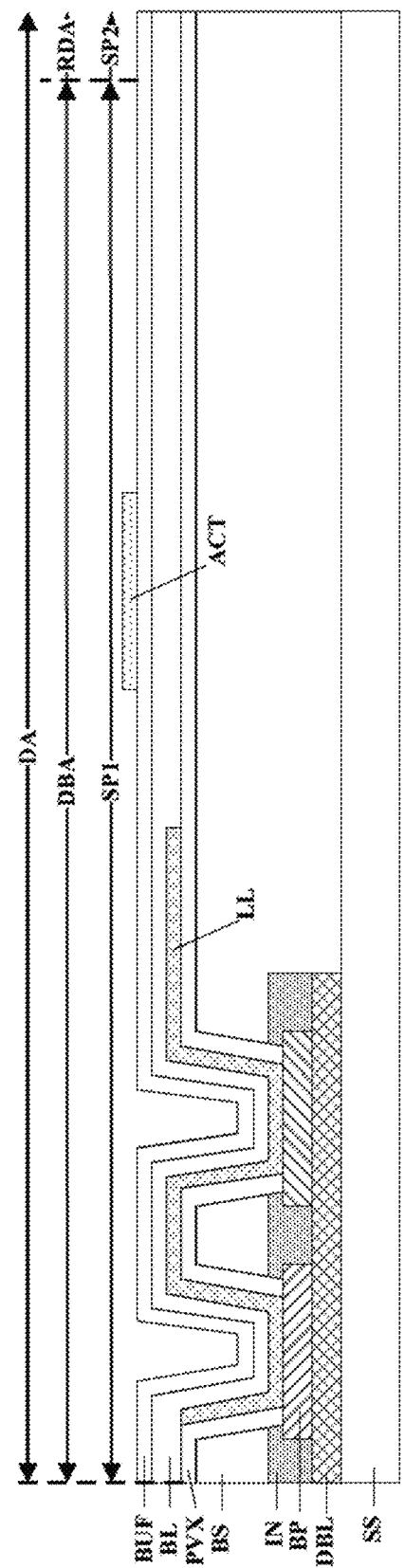

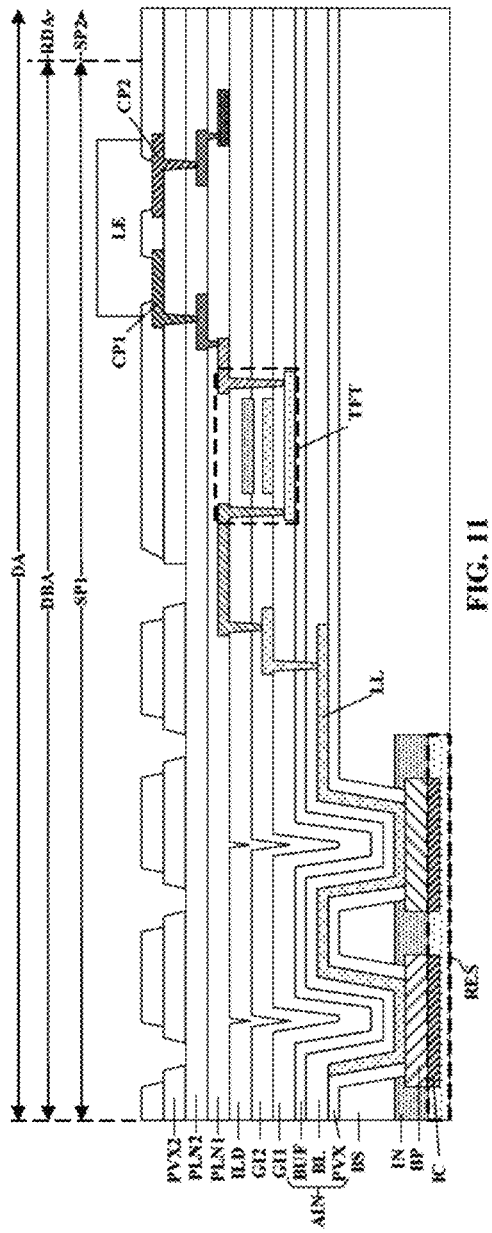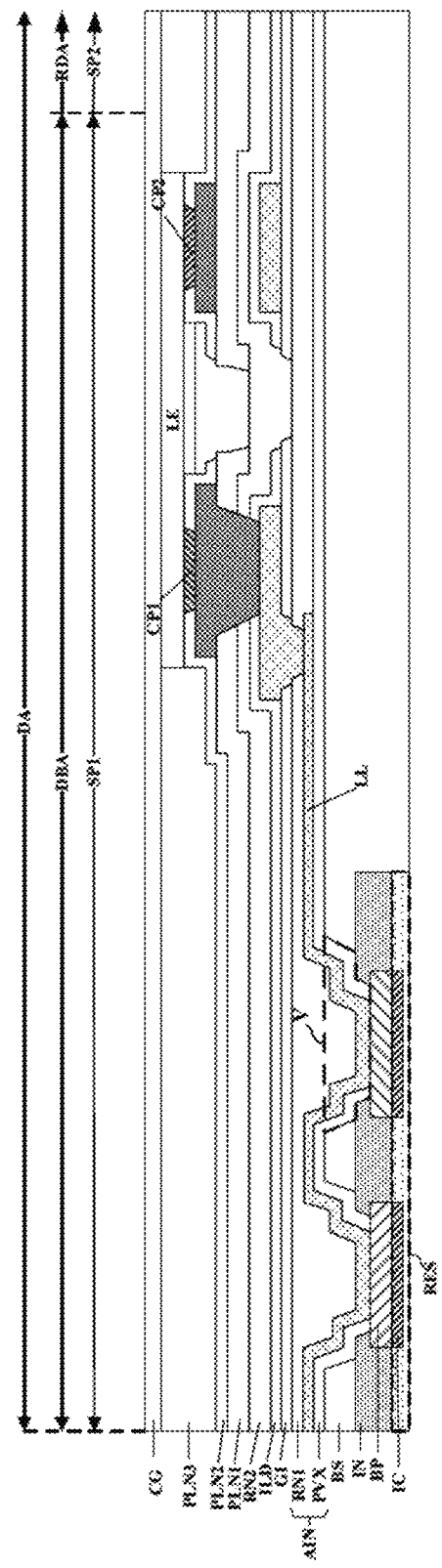

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2020/080810, filed Mar. 24, 2020, which is a continuation-in-part of International Application No. PCT/CN2019/110779, filed Oct. 12, 2019. Each of the forgoing applications is herein incorporated by reference in its entirety for all purposes.

TECHNICAL FIELD

The present invention relates to display technology, more particularly, to an array substrate, a display apparatus, and a method of fabricating an array substrate.

BACKGROUND

Technologies for fabricating a display apparatus having a narrow frame rapidly develops. Various methods used to fabricate a display apparatus having a narrow frame include, but are not limited to chip on film (COF), chip on plastic (COP), and gate driver on array (GOA). For example, chip on film (COF) and chip on plastic (COP) are used to fabricate a display panel having a narrow bottom portion of a frame. Gate driver on array (GOA) is used to fabricate a display having a narrow left side or a narrow right side of a frame.

SUMMARY

In one aspect, the present disclosure provides an array substrate, comprising a display area having a plurality of subpixels; wherein the display area comprises a regular display sub-area and a display-bonding sub-area; the plurality of subpixels comprises a plurality of first subpixels in the display-bonding sub-area and a plurality of second subpixels in the regular display sub-area; wherein the array substrate comprises a base substrate extending throughout the regular display sub-area and the display-bonding sub-area; and a plurality of thin film transistors on a first side of the base substrate and respectively in the plurality of subpixels; wherein a respective one of the plurality of first subpixels comprises a bonding pad on a second side of the base substrate, wherein the second side is opposite to the first side: a lead line electrically connecting a respective one of the plurality of thin film transistors to the bonding pad, wherein the lead line is unexposed in the array substrate; and a via extending through the base substrate; wherein the lead line extends from the first side to the second side of the base substrate through the via, to connect to the bonding pad.

Optionally, the array substrate further comprises an insulating layer on the second side of the base substrate and limited in the display-bonding sub-area; wherein the bonding pad is on a side of the insulating layer away from the base substrate; and the via extends through the base substrate and the insulating layer.

Optionally, the base substrate has a first thickness t1 in a region corresponding to the bonding pad, and has a second thickness t2 in a region outside the region corresponding to the bonding pad; the insulating layer has a third thickness t3; and $t2 > (t1 + t3)$.

Optionally, the array substrate further comprises a recess in a region corresponding to the bonding pad for bonding the bonding pad with an integrated circuit; wherein the recess is on the second side of the base substrate, exposing a surface of the bonding pad.

Optionally, the array substrate further comprises an insulating layer on the second side of the base substrate and limited in the display-bonding sub-area; wherein the bonding pad is on a side of the insulating layer away from the base substrate; the via extends through the base substrate and the insulating layer; and the recess exposes the surface of the bonding pad and a surface of the insulating layer.

Optionally, the base substrate has a first thickness t1 in a region corresponding to the bonding pad, and has a second thickness t2 in a region outside the region corresponding to the bonding pad; the insulating layer has a third thickness t3; the recess has a fourth thickness t4; and t2 is substantially equal to a sum of t1, t3, and t4.

Optionally, the array substrate further comprises a plurality of additional insulating layers, each of which partially extending into the via.

Optionally, the plurality of additional insulating layers comprise a passivation layer extending throughout the display area; wherein the passivation layer is on the first side of the base substrate, and at least partially covering a lateral side of the via; and the lead line is on a side of the passivation layer away from the insulating layer.

Optionally, the plurality of additional insulating layers comprise further comprises a barrier layer extending throughout the display area; wherein the barrier layer is on a side of the passivation layer and the lead line away from the base substrate; and the insulating layer, the bonding pad, the passivation layer, and the barrier layer encapsulate the lead line inside the array substrate.

Optionally, the plurality of additional insulating layers comprise further comprises a buffer layer extending throughout the display area; wherein the respective one of the plurality of thin film transistors comprises an active layer on a side of the buffer layer away from the base substrate.

Optionally, the base substrate is a flexible base substrate.

In another aspect, the present disclosure provides a display apparatus, comprising the array substrate described herein or fabricated by a method described herein, and one or more integrated circuits connected to the array substrate.

In another aspect, the present disclosure provides a method of fabricating an array substrate, comprising forming a display area having a plurality of subpixels; wherein forming the display area comprises forming a regular display sub-area and forming a display-bonding sub-area: forming the plurality of subpixels comprises forming a plurality of first subpixels in the display-bonding sub-area and forming a plurality of second subpixels in the regular display sub-area; wherein the method comprises forming a base substrate extending throughout the regular display sub-area and the display-bonding sub-area; and forming a plurality of thin film transistors on a first side of the base substrate and respectively in the plurality of subpixels; wherein forming a respective one of the plurality of first subpixels comprises forming a bonding pad on a second side of the base substrate, wherein the second side is opposite to the first side; forming a lead line electrically connecting a respective one of the plurality of thin film transistors to the bonding pad, wherein the lead line is unexposed in the array substrate; and forming a via extending through the base substrate; wherein the lead line is formed to extend from the first side to the second side of the base substrate through the via, to connect to the bonding pad.

Optionally, the method further comprises providing a support substrate; forming a debonding layer limited in the display-bonding sub-area, and in a region corresponding to the bonding pad; forming the bonding pad on a side of the debonding layer away from the support substrate; forming an insulating material layer limited in the display-bonding sub-area; forming a base substrate material layer throughout the regular display sub-area and the display-bonding sub-area, and on a side of the insulating material layer away from the support substrate; and etching the insulating material layer and the base substrate material layer to form the via extending through the insulating material layer and the base substrate material layer to expose a contacting surface of the bonding pad, thereby forming an insulating layer limited in the display-bonding sub-area, and the base substrate on the insulating layer.

Optionally, the method further comprises forming a passivation material layer throughout the regular display sub-area and the display-bonding sub-area, and on a side of the base substrate away from the support substrate; and etching the passivation material layer to expose the contacting surface of the bonding pad, thereby forming a passivation layer; wherein the passivation layer is formed on the first side of the base substrate, and at least partially covering a lateral side of the via.

Optionally, the method further comprises forming the lead line of a side of the passivation layer away from the base substrate; wherein the lead line is formed to extend into the via to connect to the bonding pad.

Optionally, the method further comprises forming a barrier layer throughout the regular display sub-area and the display-bonding sub-area, and on a side of the lead line away from the base substrate; forming a buffer layer throughout the regular display sub-area and the display-bonding sub-area, and on a side of the barrier layer away from the base substrate; and forming an active layer on a side of the buffer layer away from the base substrate.

Optionally, the method further comprises separating the debonding layer from the bonding pad and the insulating layer, thereby forming a recess in a region corresponding to the bonding pad; wherein the recess is formed on the second side of the base substrate, exposing a surface of the bonding pad.

Optionally, the method further comprises providing an integrated circuit in the recess, the integrated circuit connecting to the surface of the bonding pad exposed in the recess.

Optionally, the method further comprises forming a plurality of light emitting elements respectively in the plurality of subpixels including the plurality of first subpixels and the plurality of second subpixels.

BRIEF DESCRIPTION OF THE FIGURES

The following drawings are merely examples for illustrative purposes according to various disclosed embodiments and are not intended to limit the scope of the present invention.

FIG. 9A to FIG. 9M are schematic diagram illustrating a method of fabricating an array substrate in some embodiments according to the present disclosure.

FIG. 11 is a cross-sectional view of a display apparatus in some embodiments according to the present disclosure.

FIG. 12 is a cross-sectional view of a display apparatus in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides an array substrate or a display panel having the driving circuits integrated onto a back side of the array substrate or the display panel. In doing so, the frame width of the display panel can be significantly reduced because these driving circuits are not disposed on the frame portion. Electrical connection between signal lines and the driving circuits can be accomplished. e.g., by a through-PI-via (TPV) technique. It is discovered in the present disclosure that lead lines connecting the signal lines of the driving circuits are prone to erosion due to their exposure to the external environment.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate. In some embodiments, the array substrate includes a display area having a plurality of subpixels. Optionally, the display area includes a regular display sub-area and a display-bonding sub-area. Optionally, the plurality of subpixels includes a plurality of first subpixels in the display-bonding sub-area and a plurality of second subpixels in the regular display sub-area. Optionally, the array substrate includes a base substrate extending throughout the regular display sub-area and the display-bonding sub-area; and a plurality of thin film transistors on a first side of the base substrate and respectively in the plurality of subpixels. Optionally, a respective one of the plurality of first subpixels includes a bonding pad on a second side of the base substrate, and the second side is opposite to the first side; a lead line electrically connecting a respective one of the plurality of thin film transistors to the bonding pad, and the lead line is unexposed in the array substrate; and a via extending through the base substrate. Optionally, the lead line extends from the first side to the second side of the base substrate through the via, to connect to the bonding pad. The array substrate described herein can be used for making a frameless display apparatus.

Figure 1:
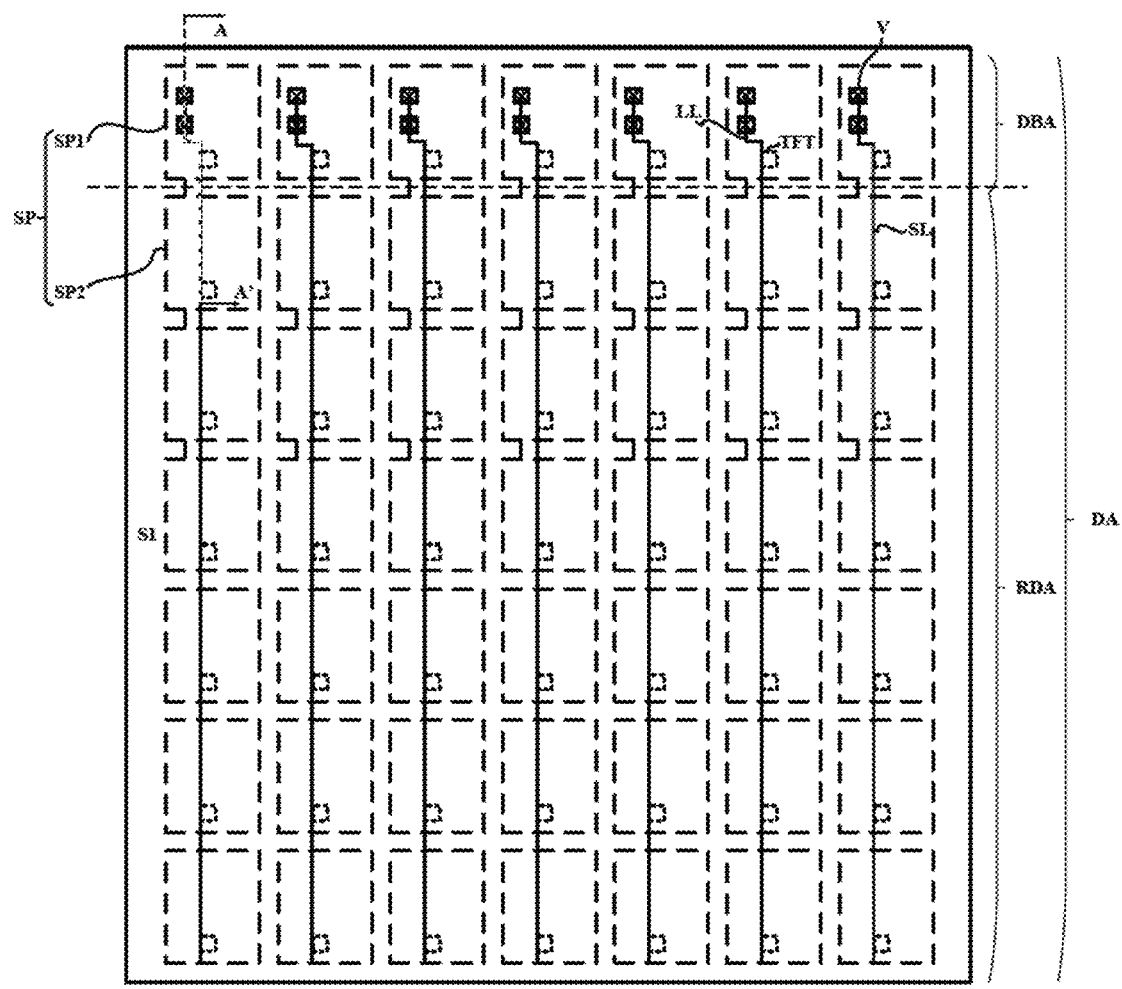
FIG. 1 is a plan view showing a structure of an array substrate on a first side of a base substrate in some embodiments according to the present disclosure.
Figure 2:
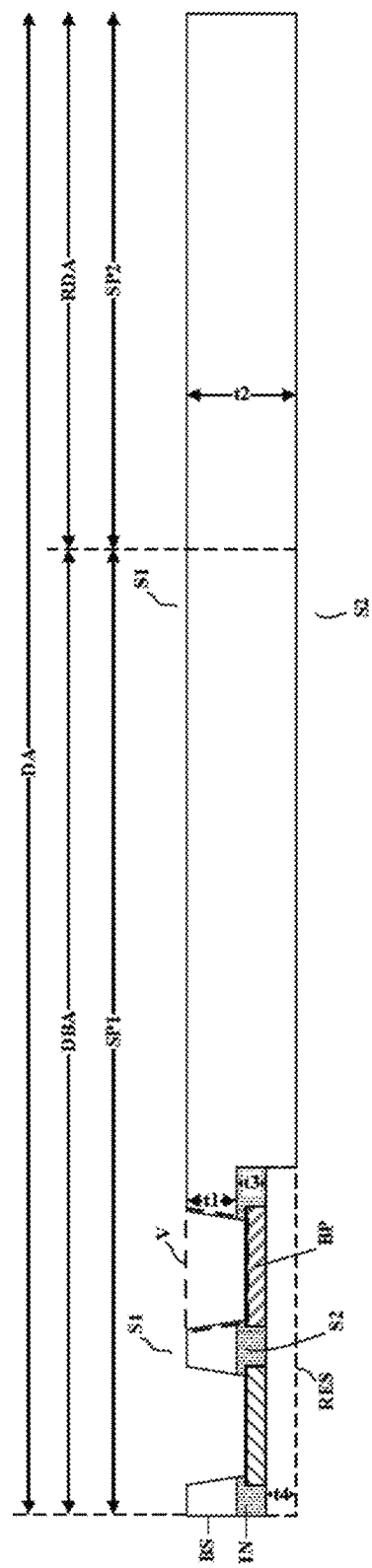
FIG. 2 is a cross-sectional view of a base substrate along an AA' line in FIG. 1.

FIG. 1 is a plan view showing a structure of an array substrate on a first side of a base substrate in some embodiments according to the present disclosure. FIG. 2 is a cross-sectional view of a base substrate along an AA' line in FIG. 1. In some embodiments, referring to FIG. 1 and FIG. 2, the array substrate includes a display area DA having a plurality of subpixels SP. Optionally, the arrays substrate includes a base substrate BS having a first side S1 and a second side S2 opposite to the first side S1. Optionally, the base substrate BS is a flexible base substrate.

As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

A respective one of the plurality of subpixels SP includes a subpixel region and a portion of the inter-subpixel regions surrounding the subpixel region.

Optionally, the display area DA includes a regular display sub-area RDA and a display-bonding sub-area DBA. Optionally, the plurality of subpixels SP include a plurality of first subpixels SP1 in the display-bonding sub-area DBA and a plurality of second subpixels SP2 in the regular display sub-area RDA. Optionally, the base substrate BS extends throughout the regular display sub-area RDA and the display-bonding sub-area DBA.

Figure 3:
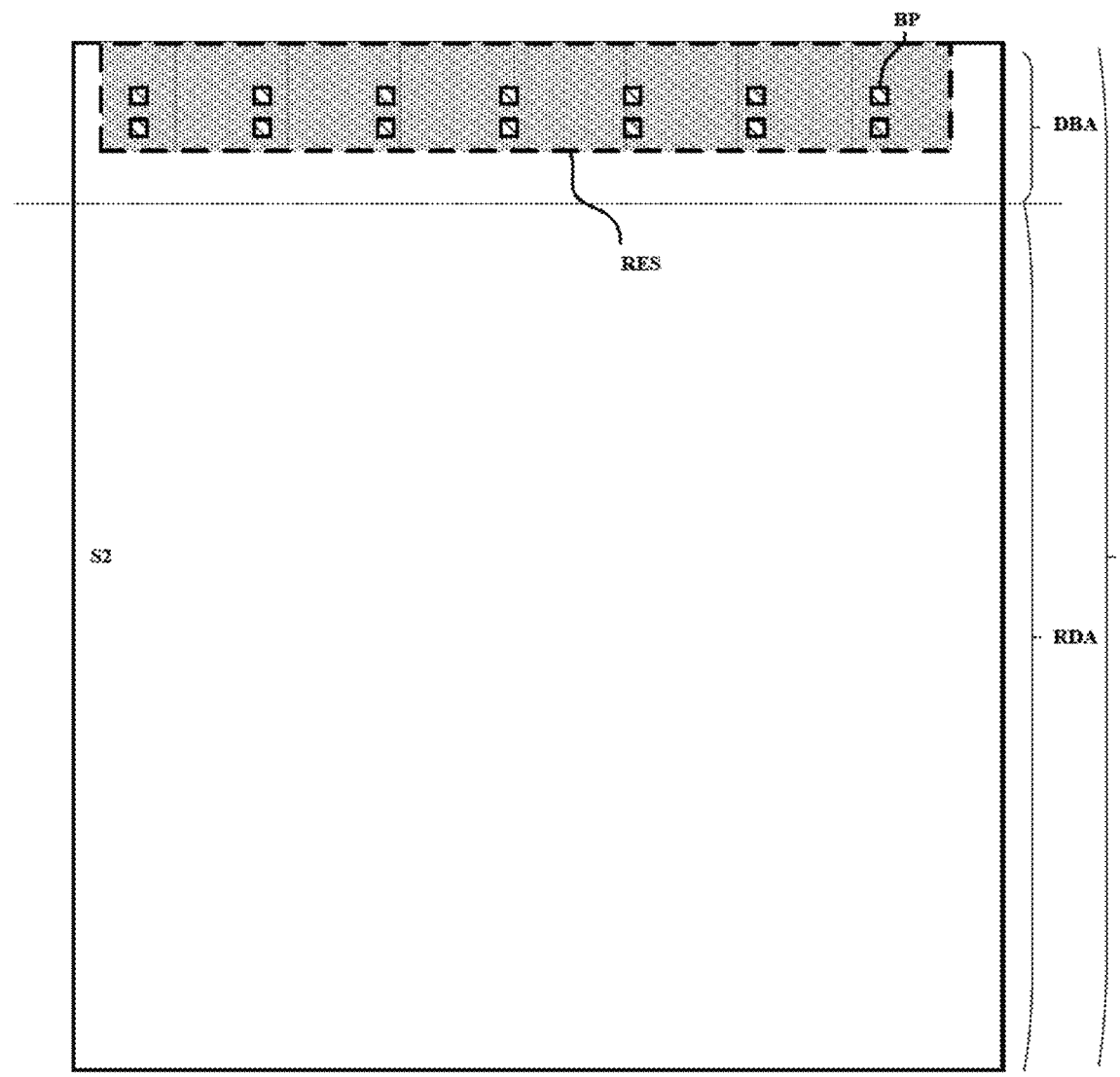
FIG. 3 is a plan view showing a structure of an array substrate on a second side of a base substrate in some embodiments according to the present disclosure.

FIG. 3 is a plan view showing a structure of an array substrate on a second side of a base substrate in some embodiments according to the present disclosure. Optionally, the display-bonding sub-area DBA is abutting a portion of a boundary of the display area DA. Optionally, the regular display sub-area RDA is abutting a side of the display-bonding sub-area DBA.

Figure 4:
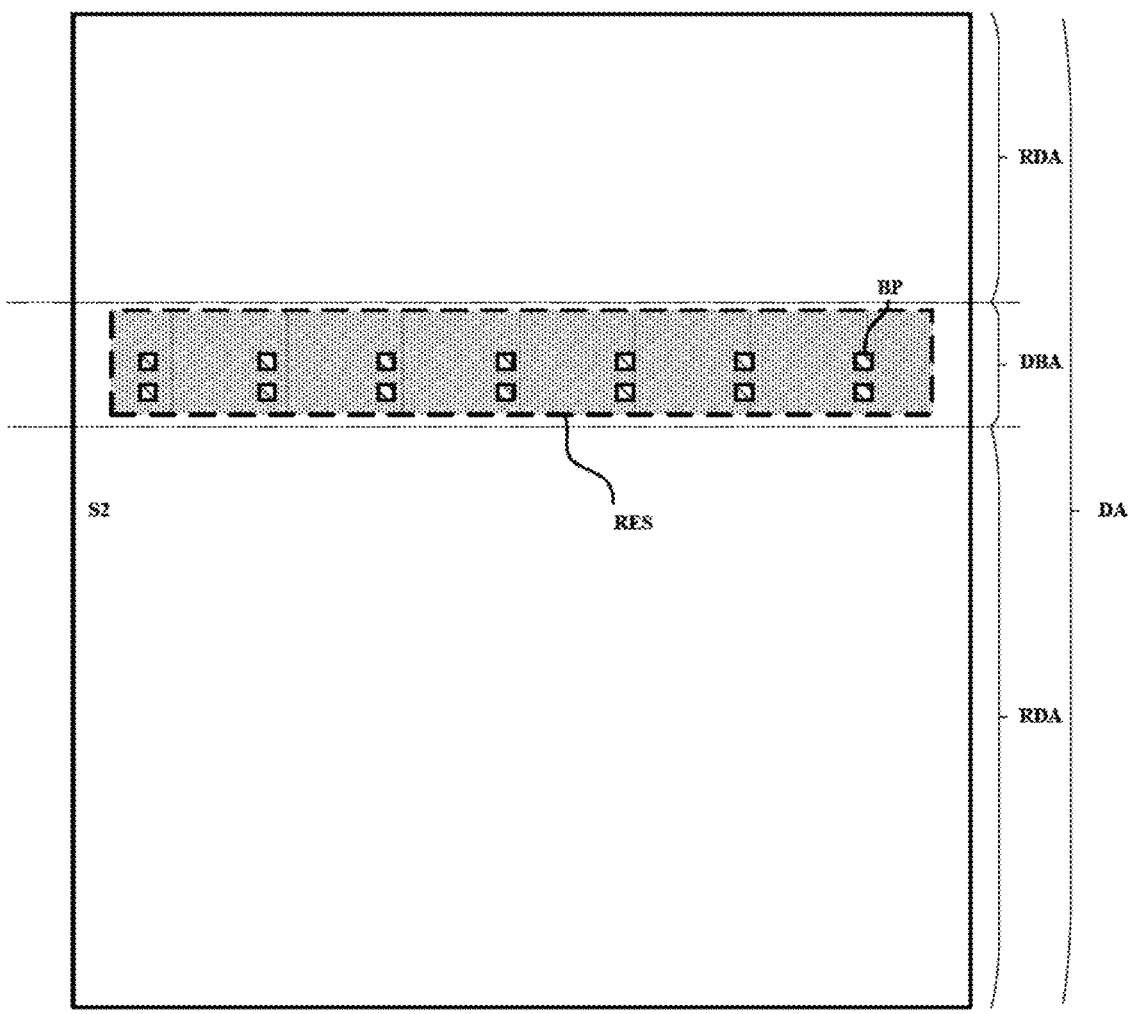
FIG. 4 is a plan view showing a structure of an array substrate on a second side of a base substrate in some embodiments according to the present disclosure.

FIG. 4 is a plan view showing a structure of an array substrate on a second side of a base substrate in some embodiments according to the present disclosure. Optionally, the display-bonding sub-area DBA and the boundary of the display area DA are spaced apart. Optionally, the regular display sub-area RDA is abutting at least two sides of the display-bonding sub-area DBA. For example, the display bounding sub-area DBA is in the central portion of the display area DA.

Figure 5:
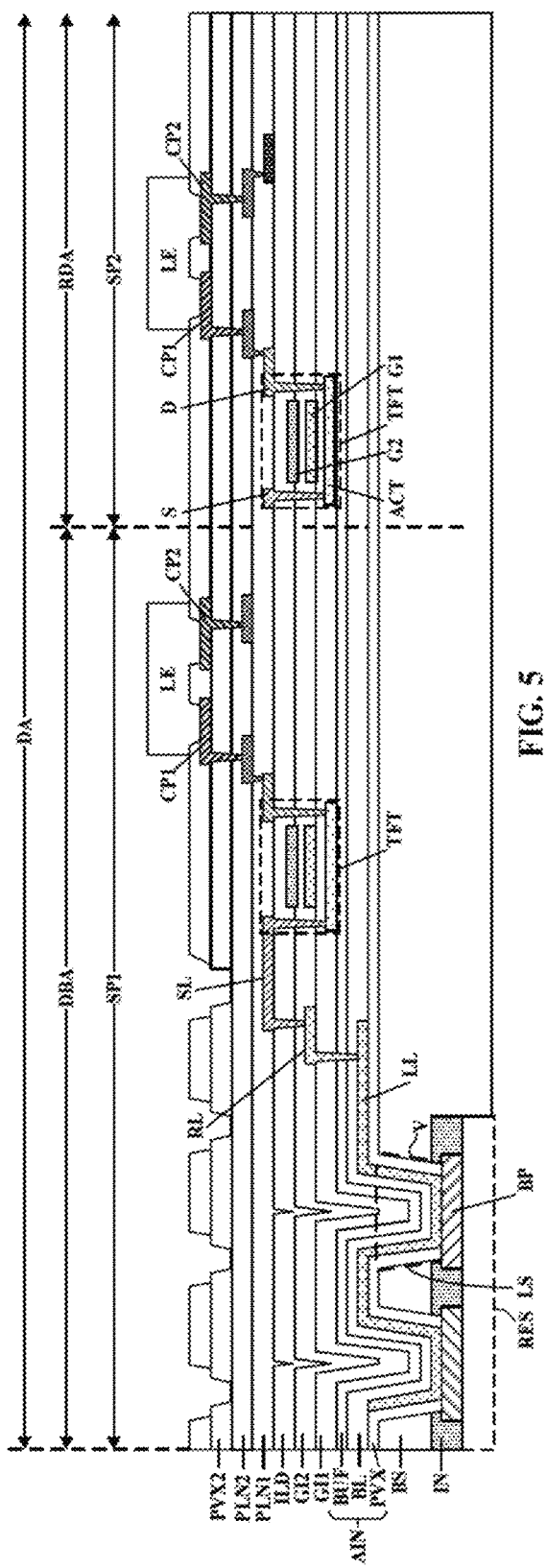
FIG. 5 is a cross-sectional view of an array substrate along an AA' line in FIG. 1.

FIG. 5 is a cross-sectional view of an array substrate along an AA' line in FIG. 1. Referring to FIG. 2 and FIG. 5, a plurality of thin film transistors TFT is on the first side S1 of the base substrate BS and respectively in the plurality of subpixels SP. Optionally, a respective one of the plurality of thin film transistors TFT is selected from a group consisting of a top gate thin film transistor, and a bottom gate thin film transistors. For example, a respective one of the plurality of thin film transistors TFT includes a first gate electrode G1, a second gate electrode G2, an active layer ACT, a source electrode S electrically connected to the active layer ACT, and a draining electrode D electrically connected to the active layer ACT.

Figure 6:
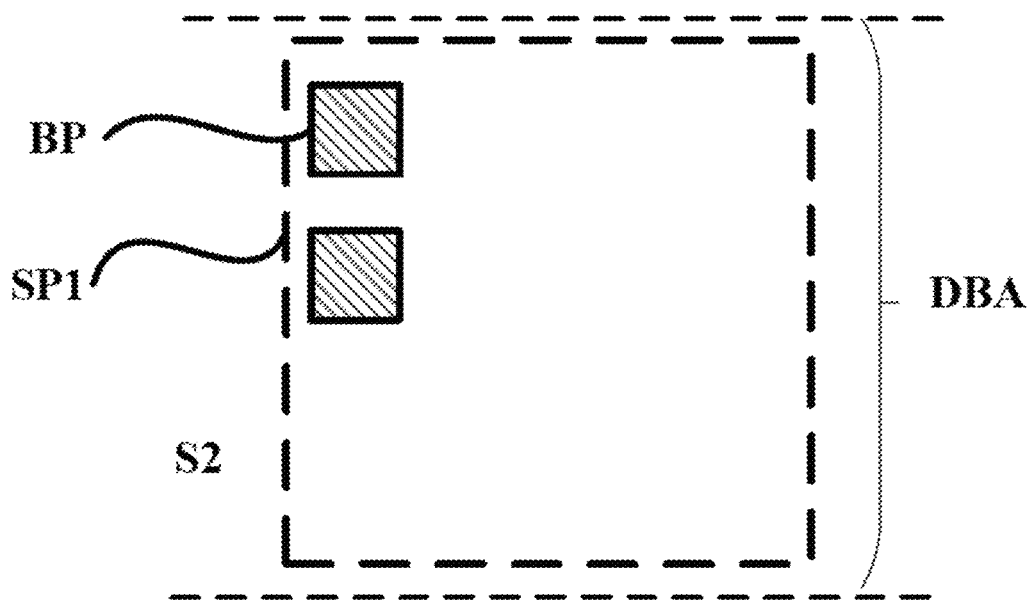
FIG. 6 is a zoom-in view showing a structure of a respective one of a plurality of first subpixels on a second side of a base substrate in some embodiments according to the present disclosure.
Figure 7A:
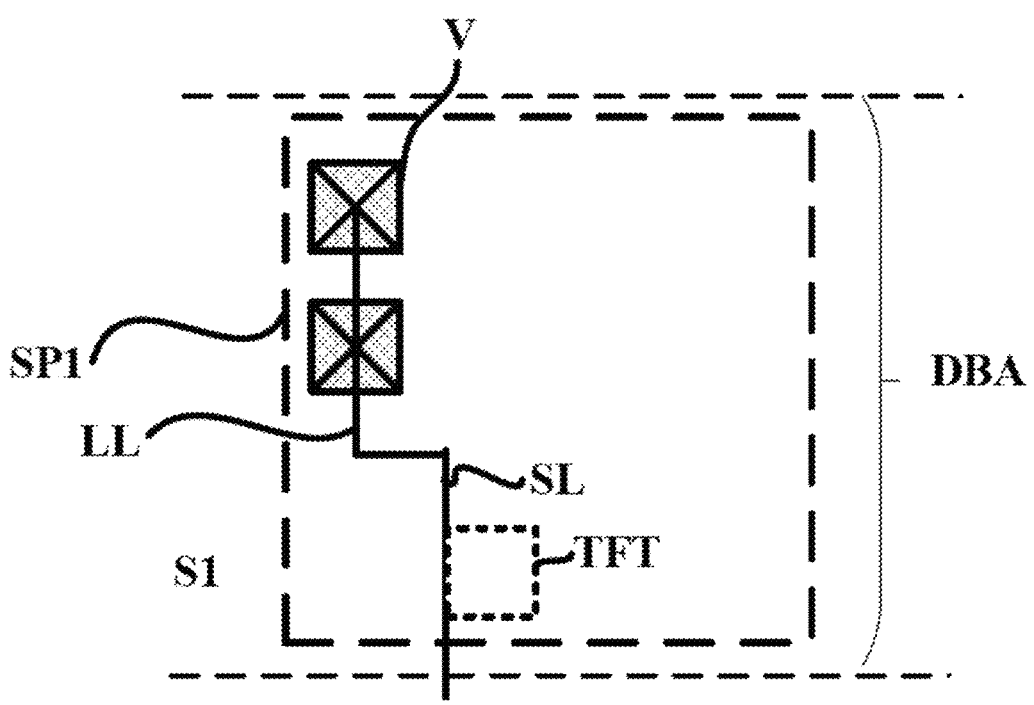
FIG. 7A is a zoom-in view showing a structure of a respective one of a plurality of first subpixels on a first side of a base substrate in some embodiments according to the present disclosure.

FIG. 6 is a zoom-in view showing a structure of a respective one of a plurality of first subpixels on a second side of a base substrate in some embodiments according to the present disclosure. FIG. 7A is a zoom-in view showing a structure of a respective one of a plurality of first subpixels on a first side of a base substrate in some embodiments according to the present disclosure. Referring to FIG. 2, FIG. 5, and FIG. 6, a respective one of the plurality of first subpixels SP1 includes a bonding pad BP on the second side S2 of the base substrate BS.

Optionally, a surface of the bonding pad BP is exposed on the second side S2 of the base substrate BS, and the bonding pad BP can be bonded to an integrated circuit from the second side S2 of the base substrate BS, so a frame of a display apparatus used to accommodate the bonding pad BP is not necessary, because the bonding pad BP can be put on the second side S2 of the base substrate BS, and the display area DA is large enough to accommodate the bonding pad BP. Optionally, the array substrate is absent of a bonding area.

Referring to FIG. 5, FIG. 6 and FIG. 7A, the respective one of the plurality of first subpixels SP1 includes a lead line LL electrically connecting a respective one of the plurality of thin film transistors TFT to the bonding pad BP. Optionally, the lead line LL is limited in the display-bonding sub-area DBA. In another example, the lead line LL extends through the display-bonding sub-area DBA and the regular display sub-area RDA.

Optionally, a lead line LL is electrically connecting to a signal line SL. Optionally, the signal line SL is selected from a group consisting of a gate line, a data line, a touch signal line, a clock signal line, a high power voltage line, a low power voltage line, a common signal line, and a floating signal line. For example, a lead line LL is electrically connected to a data line, thereby to connect the respective one of the plurality of thin film transistors TFT to the bonding pad BP. Optionally, the signal line SL and the lead line LL are formed in different layer.

Referring to FIG. 5, the respective one of the plurality of first subpixels SP1 includes a relay line RL connecting the lead line LL to the signal line SL. For example, the lead line LL connects the bonding pad BP to the relay line RL, and the relay line RL connects the lead line LL to the signal line SL (e.g., the data line), thereby the lead line LL electrically connects the respective one of the plurality of thin film transistors TFT to the bonding pad BP. Optionally, the signal line SL and the relay line RL are formed in different layer. Optionally, the relay line RL and the lead line LL are formed in different layer.

Figure 7B:
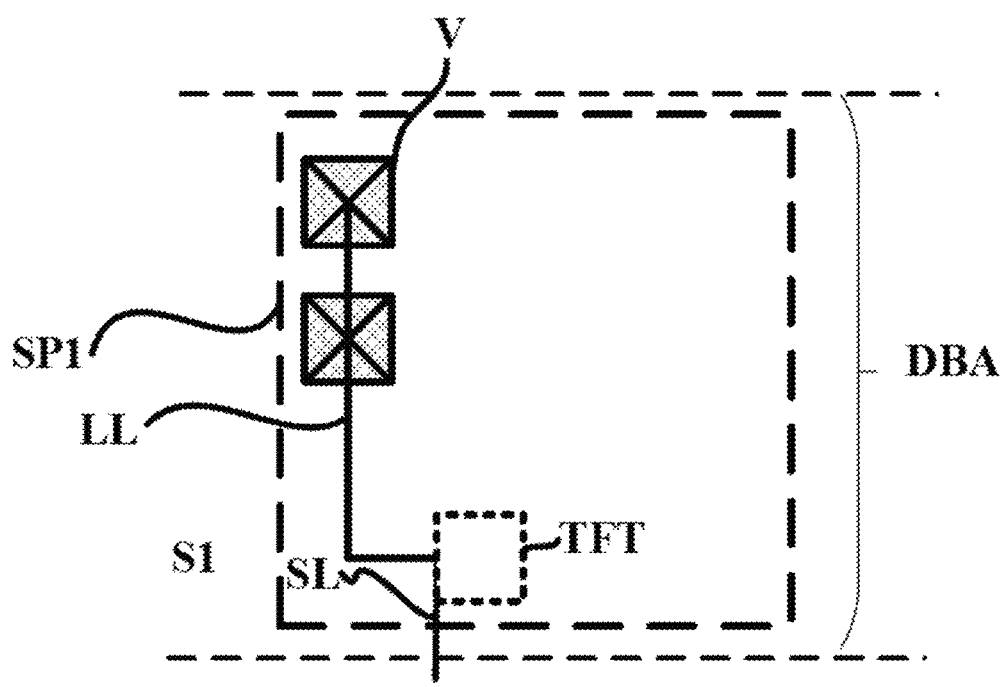
FIG. 7B is a zoom-in view showing a structure of a respective one of a plurality of first subpixels on a first side of a base substrate in some embodiments according to the present disclosure.

FIG. 7B is a zoom-in view showing a structure of a respective one of a plurality of first subpixels on a first side of a base substrate in some embodiments according to the present disclosure. Referring to FIG. 5, FIG. 6 and FIG. 7B, optionally, the lead line LL is electrically connected to the source electrode of the respective one of the plurality of thin film transistors TFT. Optionally, the relay line RL connects the lead line LL to the source electrode of the respective one of the plurality of thin film transistors TFT.

Referring to FIG. 5, the lead line LL is unexposed in the array substrate. For example, the lead line LL is encapsulated by a plurality of additional insulating layers in the array substrate except for in regions corresponding to portions of the lead line LL electrically connected to the bonding pad BP, to the signal line SL, or to the relay line RL. Optionally, the lead line LL is not in direct contact with the base substrate BS. When the base substrate BS is removed from the array substrate, the lead line LL will not be exposed to air and water vapor, which prevent air and water vapor from contacting and eroding the lead line LL.

Referring to FIG. 5 and FIG. 6, the respective one of the plurality of first subpixels SP1 includes a via V extending through the base substrate BS. Optionally, the via V exposes a portion of a surface of the bonding pad BP closer to the lead line LL. Optionally, the lead line LL extends from the first side S1 to the second side S2 of the base substrate BS through the via V, to connect to the bonding pad BP.

In some embodiments, referring to FIG. 2 and FIG. 5, the array substrate further includes a recess RES in a region corresponding to the bonding pad BP for bonding the bonding pad BP with an integrated circuit.

Optionally, the recess RES is on the second side S2 of the base substrate BS, exposing a surface of the bonding pad BP away from the lead line LL. For example, the recess RES does not expose any surface of the lead line LL.

In some embodiments, referring to FIG. 2 and FIG. 5, the array substrate further includes an insulating layer IN on the second side S2 of the base substrate BS. Optionally, the insulating layer IN is limited in the display-bonding sub-area DBA.

Optionally, the bonding pad BP is on a side of the insulating layer IN away from the base substrate BS. Optionally, the via V extends through the base substrate BS and the insulating layer IN to expose the surface of the bounding pad BP closer to the lead line LL.

Optionally, the recess RES is in a region corresponding to the insulating layer IN. Optionally, the recess RES exposes the surface of the bonding pad BP away from the lead line LL and a surface of the insulating layer IN away from the lead line LL.

Optionally, the base substrate BS has a first thickness t1 in the region corresponding to the bonding pad BP, and has a second thickness t2 in a region outside the region corresponding to the bonding pad BP. Optionally, the insulating layer IN has a third thickness t3. Optionally, t2>(t1+t3).

Optionally, the recess RES has a fourth thickness t4. Optionally, t2 is substantially equal to a sum of t1, t3, and t4. As used herein, the term "substantially equal to" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

In some embodiments, referring to FIG. 5, the array substrate further includes the plurality of additional insulating layers AIN, each of which partially extending into the via V. Optionally, each of the plurality of additional insulating layers AIN extends throughout the regular display sub-area RDA and the display-bonding sub-area DBA.

Optionally, the plurality of additional insulating layers AIN include a passivation layer PVX extending throughout the display area DA. For example, the passivation layer PVX extends throughout the region corresponding to the bonding pad BP.

Optionally, the passivation layer PVX is on the first side S1 of the base substrate BS. Optionally, the passivation layer PVX at least partially covers a lateral side LS of the via V. Optionally, the passivation layer PVX is between the base substrate BS and the lead line LL except for in a region corresponding to a portion of the lead line LL electrically connected to the bonding pad BP and except for in a region corresponding to a portion of the passivation layer PVX in direct contact with the insulating layer IN. The passivation layer PVX prevents water vapor from contacting and eroding the lead line LL.

In some embodiments, the plurality of additional insulating layers AIN include a barrier layer BL extending throughout the display area DA. Optionally, the barrier layer BL extends throughout the regular display sub-area RDA and the display-bonding sub-area DBA. Optionally, the barrier layer BL extends throughout the region corresponding to the bonding pad BP.

Optionally, the barrier layer BL is on a side of the passivation layer PVX and the lead line LL away from the base substrate BS. Optionally, the lead line LL is between the passivation layer PVX and the barrier layer BL except for in a region corresponding to a portion of the lead line LL electrically connected to the bonding pad BP.

Optionally, the insulating layer IN, the bonding pad BP, the passivation layer PVX, and the barrier layer BL encapsulate the lead line LL inside the array substrate, so the lead line is unexposed in the array substrate. This arrangement prevents air and water vapor from contacting and eroding the lead line LL.

In some embodiments, the plurality of additional insulating layers AIN further includes a buffer layer BUF extending throughout the display area DA. Optionally, the buffer layer BUF extends throughout the regular display sub-area RDA and the display-bonding sub-area DBA.

Optionally, the buffer layer BUF is on a side of the barrier layer BL away from the base substrate BS. Optionally, the respective one of the plurality of thin film transistors TFT includes the active layer ACT on a side of the buffer layer BL away from the base substrate BS.

In some embodiments, the array substrate further includes a first gate insulating layer GI1 extending throughout the display area DA. Optionally, the first gate insulating layer GI1 extends throughout the regular display sub-area RDA and the display-bonding sub-area DBA. Optionally, the first gate insulating layer GI1 is on a side of the buffer layer BUF away from the barrier layer BL. Optionally, the respective one of the plurality of thin film transistors TFT includes the first gate electrode G1 on a side of the first gate insulating layer GI1 away from the active layer ACT.

In some embodiments, the array substrate further includes a second gate insulating layer GI2 extending throughout the display area DA. Optionally, the second gate insulating layer GI2 extends throughout the regular display sub-area RDA and the display-bonding sub-area DBA. Optionally, the second gate insulating layer GI2 is on a side of the first insulating layer GI1 away from the buffer layer BUF. Optionally, the respective one of the plurality of thin film transistors TFT includes the second gate electrode G2 on a side of the second gate insulating layer GI2 away from the first gate electrode G1.

In some embodiments, the array substrate further includes an interlayer-dielectric layer ILD extending throughout the display area DA. Optionally, the interlayer-dielectric layer ILD extends throughout the regular display sub-area RDA and the display-bonding sub-area DBA. Optionally, the interlayer-dielectric layer ILD is on a side of the second gate insulating layer GI2 away from the first insulating layer GI1. Optionally, the signal line SL is on a side of the interlayer-dielectric layer ILD away from the base substrate BS.

Optionally, a source electrode S of the respective one of the plurality of thin film transistors TFT extends through the first gate insulating layer GI1, the second gate insulating layer GI2, and the interlay-dielectric layer LD and connects the active layer ACT to the signal line SL. Optionally, a drain electrode D of the respective one of the plurality of thin film transistors TFT extends through the first gate insulating layer GI1, the second gate insulating layer GI2, and the interlay-dielectric layer ILD and connects the active layer ACT to a respective one of a plurality of light emitting elements LE.

Optionally, the source electrode S of the respective one of the plurality of thin film transistors TFT extends through the first gate insulating layer GI1, the second gate insulating layer GI2, and the interlay-dielectric layer ILD to connect to the relay line RL. Optionally, the source electrode S of the respective one of the plurality of thin film transistors TFT extends through the first gate insulating layer GI1, the second gate insulating layer GI2, and the interlay-dielectric layer ILD to the lead line LL.

Optionally, the respective one of the plurality of thin film transistors TFT having a source electrode S connected with the relay line RL or the lead line LL is in the display-bonding sub-area DBA. Optionally, the respective one of the plurality of thin film transistors TFT having a source electrode S connected with the relay line RL or the lead line LL is in the regular display sub-area RDA.

In some embodiments, the array substrate further includes a first planarization layer PLN1 on a side of the inter-layer dielectric layer ILD away from the second gate insulating layer GI2. Optionally, the first planarization layer PLN1 extends throughout the display area DA. Optionally, the first planarization layer PLN1 extends throughout the regular display sub-area RDA and the display-bonding sub-area DBA.

In some embodiments, the array substrate further includes a second planarization layer PLN2 on a side of the first planarization layer PLN1 away from the inter-layer dielectric layer ILD. Optionally, the second planarization layer PLN2 extends throughout the display area DA. Optionally, the second planarization layer PLN2 extends throughout the regular display sub-area RDA and the display-bonding sub-area DBA.

In some embodiments, the array substrate further includes a second passivation layer PVX2 on a side of the second planarization layer PLN2 away from the first planarization layer PLN1; and a first contacting pad CP1 and a second contacting pad CP2 on a side of the second passivation layer PVX2 away from the second planarization layer PLN2. Optionally, the first contacting pad CP1 is electrically connected to the drain electrode D of the respective one of the plurality of thin film transistors TFT. Optionally, the second contacting pad CP2 is electrically connected to a common signal line.

In some embodiments, the respective one of the plurality of light emitting elements LE is selected from a group consisting of a light emitting element for a liquid crystal display (LCD), a light emitting diode (LED), a micro light emitting diode (Micro-LED), a quantum light emitting diode (QLED), and an organic light emitting diode (OLED).

For example, the respective one of the plurality of light emitting elements LE is a micro light emitting diode (Micro-LED) having a cathode and an anode. The array substrate further includes a first contact pad CP1 electrically connected to the drain electrode of the respective one of the plurality of thin film transistors TFT and a second contact pad CP2. The first contact pad CP1 and the second contact pad 2 are electrically connected to the cathode and the anode of the micro light emitting diode, respectively.

Various appropriate materials may be used for making the base substrate BS. Examples of materials suitable for making the base substrate include, but are not limited to, glass, quartz, polyimide, and polyester, etc.

Various appropriate materials may be used for making the bonding pad BP. Examples of materials suitable for making the bonding pad include, but are not limited to, titanium (Ti), aluminum (Al), copper (Cu), and Ti/Al/Ti.

Various appropriate insulating materials and various appropriate fabricating methods may be used to make the insulating layer IN. For example, an insulating material may be deposited on the substrate by a plasma-enhanced chemical vapor deposition (PECVD) process. Examples of appropriate insulating materials include, but are not limited to, polyimide, silicon oxide (SiOy), silicon nitride (SiNy, e.g., Si3N4), and silicon oxynitride (SiOxNy). For example, the insulating layer IN is made of silicon oxide ($SiO_2$), and is configured to protect the bonding pad PB from being exposed to air and water vapor. Forming the insulating layer IN using silicon oxide ($SiO_2$) may increase the adhesion between the insulating layer IN and the base substrate BS.

Various appropriate insulating materials and various appropriate fabricating methods may be used to make the passivation layer PVX. For example, a material may be deposited on the substrate by a plasma-enhanced chemical vapor deposition (PECVD) process. Examples of appropriate materials include, but are not limited to, polyimide, silicon oxide (SiOy), silicon nitride (SiNy, e.g., Si3N4), and silicon oxynitride (SiOxNy). For example, the passivation layer PVX is made of silicon nitride (SiNy), and is configured to protect the lead line LL from being exposed to air and water vapor.

Various appropriate materials may be used for making the lead line LL. Examples of materials suitable for making the lead line include, but are not limited to, copper (Cu), aluminum (Al), and a combination of the copper and aluminum.

Various appropriate conductive electrode materials and various appropriate fabricating methods may be used to make the source electrode S and the drain electrode D. In some embodiments, the conductive electrode material includes a metal material. Examples of appropriate metal materials include, but are not limited to, molybdenum, gold, and aluminum.

Various appropriate insulating materials and various appropriate fabricating methods may be used to make the buffer layer BUF, for example, an insulating material may be deposited on the base substrate BS by a plasma-enhanced chemical vapor deposition (PECVD) process. Examples of materials suitable for making the buffer layer BUF include, but are not limited to, silicon oxide (SiOx), silicon nitride (SiNx), or a combination thereof. Optionally, the buffer layer BUF may have a single-layer structure or a stacked-layer structure including two or more sub-layers (e.g., a stacked-layer structure including a silicon oxide sublayer and a silicon nitride sublayer). Optionally, the thickness of the buffer layer BUF is in a range of approximately 100 nm to approximately 400 nm. For example, the buffer layer BUF may include a silicon oxide sub-layer having a thickness in a range of approximately 50 nm to approximately 100 nm, and a silicon nitride sub-layer having a thickness in a range of approximately 100 nm to approximately 300 nm.

Various appropriate dielectric materials and various appropriate fabricating methods may be used to make the interlayer dielectric layer ILD. For example, a dielectric material may be deposited on the substrate by a plasma-enhanced chemical vapor deposition process. Examples of materials suitable for making the interlayer dielectric material layer 306a include, but are not limited to, silicon oxide (SiOy), silicon nitride (SiNy, e.g., Si3N4), silicon oxynitride (SiOxNy).

Various appropriate materials may be used for making the first contacting pad CP1 and the second contacting pad CP2. Optionally, a respective one of the first contacting pad CP1 and the second contacting pad CP2 includes two sub-layers, a first sub-layer of the two sub-layers is formed using metals including, but not limited to, molybdenum (Mo), titanium (Ti), and a combination of molybdenum (Mo) and titanium (Ti), a second sub-layer of the two sub-layers is formed using copper (Cu). Optionally, the second sub-layer is formed on a side of the first sub-layer away from the base substrate. Optionally, a thickness of the second sub-layer is 6000 Å.

Various appropriate methods may be used to bonding the first contacting pad CP1 and the second contacting pad CP2 to a light emitting element. Methods suitable include, but are not limited to, bonding using eutectic soldering, and bonding using conductive plastic.

Figure 8:
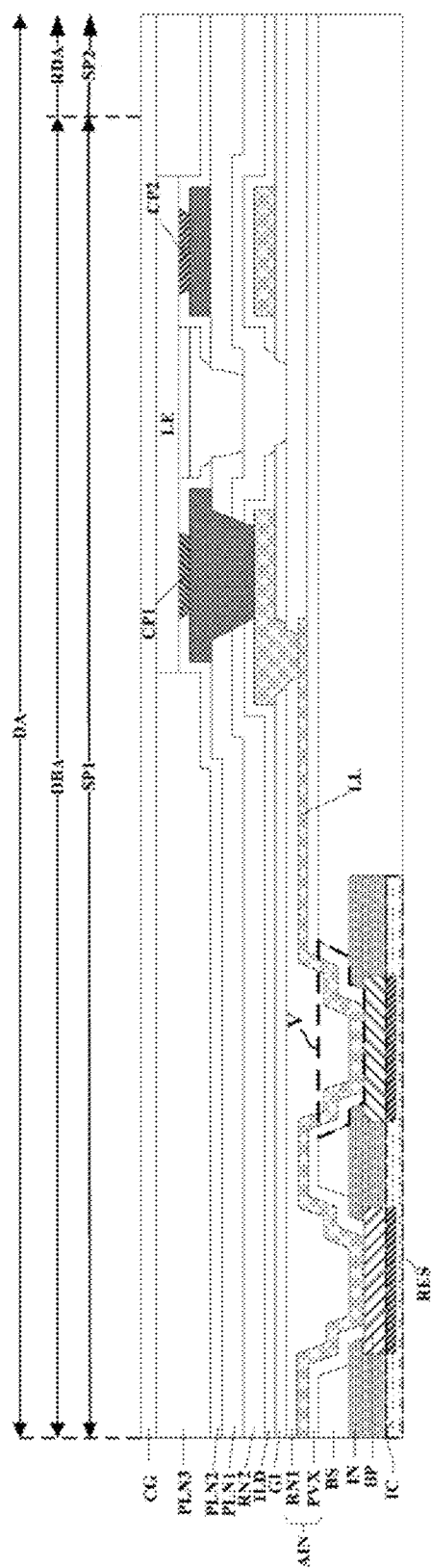
FIG. 8 is a cross-sectional view of an array substrate in some embodiments according to the present disclosure.

FIG. 8 is a cross-sectional view of an array substrate in some embodiments according to the present disclosure. In some embodiments, as shown in FIG. 8, the array substrate includes a recess RES in a region corresponding to the bonding pad BP for bonding the bonding pad BP with an intergrade circuit IC. Referring to FIG. 2 and FIG. 8, the recess RES is on the second side S2 of the base substrate BS, exposing a surface of the bonding pad BP away from the lead line LL. For example, the recess RES will not expose any surface of the lead line LL. The array substrate further includes an insulating layer IN on the second side S2 of the base substrate BS. Optionally, the insulating layer IN is limited in the display-bonding sub-area DBA. The bonding pad BP is on a side of the insulating layer IN away from the base substrate BS. A via V extends through the base substrate BS and the insulating layer IN to expose the surface of the bounding pad BP closer to the lead line LL. The recess RES is in a region corresponding to the insulating layer IN. The recess RES exposes the surface of the bonding pad BP away from the lead line LL and a surface of the insulating layer IN away from the lead line LL.

In some embodiments, referring to FIG. 8, the array substrate further includes a plurality of additional insulating layers AIN, each of which partially extending into the via V. Optionally, each of the plurality of additional insulating layers AIN extends throughout the regular display sub-area RDA and the display-bonding sub-area DBA. Optionally, the plurality of additional insulating layers AIN include a passivation layer PVX extending throughout the display area DA. For example, the passivation layer PVX extends throughout the region corresponding to the bonding pad BP.

In some embodiments, the plurality of additional insulating layers AIN include a first resin layer RN1 extending throughout the display area DA. Optionally, the first resin layer RN1 extends throughout the regular display sub-area RDA and the display-bonding sub-area DBA. Optionally, the first resin layer RN1 extends throughout the region corresponding to the bonding pad BP.

Optionally, the first resin layer RN1 is on a side of the passivation layer PVX and the lead line LL away from the base substrate BS. Optionally, the lead line LL is between the passivation layer PVX and the first resin layer RN1 except for in a region corresponding to a portion of the lead line LL electrically connected to the bonding pad BP. Optionally, the first resin layer RN1 is made of a resin material.

Optionally, the insulating layer IN, the bonding pad BP, the passivation layer PVX, and the first resin layer RN1 encapsulate the lead line LL inside the array substrate, so the lead line is unexposed in the array substrate. This arrangement prevents air and water vapor from contacting and eroding the lead line LL.

In some embodiments, the array substrate further includes a gate insulating layer GI extending throughout the display area DA. Optionally, the gate insulating layer GI extends throughout the regular display sub-area RDA and the display-bonding sub-area DBA. Optionally, the gate insulating layer GI is on a side of the first resin layer RN1 away from the passivation layer PVX.

In some embodiments, the array substrate further includes an interlayer-dielectric layer ILD extending throughout the display area DA. Optionally, the interlayer-dielectric layer ILD extends throughout the regular display sub-area RDA and the display-bonding sub-area DBA. Optionally, the interlayer-dielectric layer LD is on a side of the gate insulating layer GI away from the first resin layer RN1.

In some embodiments, the array substrate further includes a second resin layer RN2 on a side of the inter-layer dielectric layer ILD away from the gate insulating layer GI. Optionally, the second resin layer RN2 extends throughout the display area DA. Optionally, the second resin layer RN2 extends throughout the regular display sub-area RDA and the display-bonding sub-area DBA. Optionally, the second resin layer RN2 is made of a resin material.

In some embodiments, the array substrate further includes a first planarization layer PLN1 on a side of the second resin layer RN2 away from the interlayer-dielectric layer ILD. Optionally, the first planarization layer PLN1 extends throughout the display area DA. Optionally, the first planarization layer PLN1 extends throughout the regular display sub-area RDA and the display-bonding sub-area DBA.

In some embodiments, the array substrate further includes a second planarization layer PLN2 on a side of the first planarization layer PLN1 away from the second resin layer RN2. Optionally, the second planarization layer PLN2 extends throughout the display area DA. Optionally, the second planarization layer PLN2 extends throughout the regular display sub-area RDA and the display-bonding sub-area DBA.

In some embodiments, the array substrate further includes a third planarization layer PLN3 on a side of the second planarization layer PLN2 away from the first planarization layer PLN1. Optionally, the third planarization layer PLN3 extends throughout the display area DA. Optionally, the third planarization layer PLN3 extends throughout the regular display sub-area RDA and the display-bonding sub-area DBA. Optionally, the third planarization layer PLN3 is made of a polysilicone material.

In some embodiments, the array substrate further includes a first contacting pad CP1 and a second contacting pad CP2 respectively extending through the second planarization layer PLN2.

In some embodiments, the array substrate further includes a plurality of light emitting elements LE. The first contact pad CP1 and the second contact pad CP2 are electrically connected to a cathode and an anode of a respective one of the plurality of light emitting elements LE, respectively.

In another aspect, the present disclosure provides a method of fabricating an array substrate. In some embodiments, referring to FIG. 5, the method further includes forming a display area having a plurality of subpixels. Optionally, forming the display area includes forming a regular display sub-area and forming a display-bonding sub-area. Optionally, forming the plurality of subpixels includes forming a plurality of first subpixels in the display-bonding sub-area and forming a plurality of second subpixels in the regular display sub-area. Optionally, the method includes forming a base substrate extending throughout the regular display sub-area and the display-bonding sub-area; and forming a plurality of thin film transistors on a first side of the base substrate and respectively in the plurality of subpixels. Optionally, the method further includes forming a respective one of the plurality of first subpixels, which includes forming a bonding pad on a second side of the base substrate. For example, the second side is opposite to the first side. Optionally, the method further includes forming a lead line electrically connecting a respective one of the plurality of thin film transistors to the bonding pad. For example, the lead line is unexposed in the array substrate. Optionally, the method further includes forming a via extending through the base substrate. Optionally, the lead line is formed to extend from the first side to the second side of the base substrate through the via, to connect to the bonding pad.

Figure 9A:
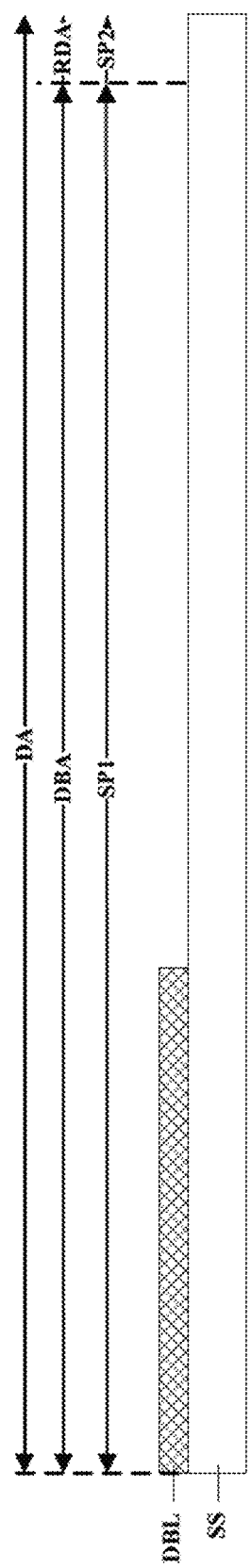

FIG. 9A to FIG. 9M are schematic diagram illustrating a method of fabricating an array substrate in some embodiments according to the present disclosure. Referring to FIG. 9A, the method includes providing a support substrate SS: and forming a debonding layer DBL. Optionally, the debonding layer DBL is limited in the display-bonding sub-area DBA. Optionally, the debonding layer DBL is in a region corresponding to the bonding pad BP.

Various materials may be used for making the support substrate SS. Examples of materials suitable for making the support substrate SS include, but are not limited to, glass, quartz, polyimide, and polyester, etc.

Various materials may be used for making the debonding layer DBL. Examples of materials suitable for making the debonding layer include, but are not limited to, polyamide. In a laser-lift-off (LLO) process, it is easy for the debonding layer to be removed from the support substrate SS and the bonding pad BP, which may lead to a separation between the support substrate SS and the array substrate.

Figure 9B:
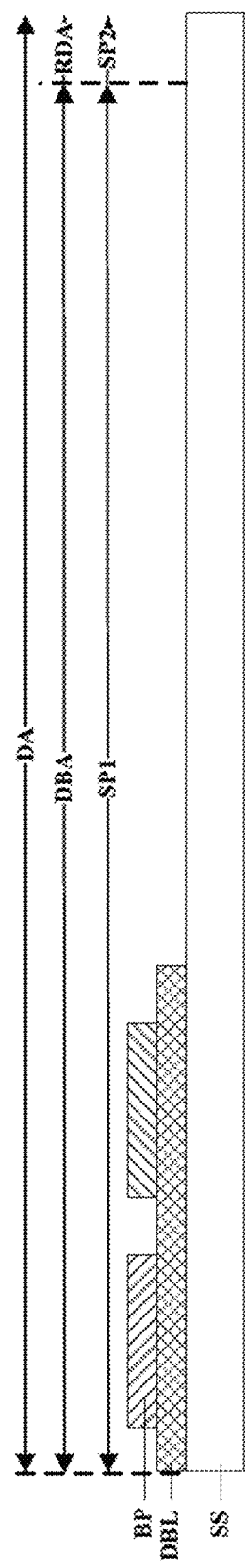

Referring to FIG. 9B, the method further includes forming the bonding pad BP on a side of the debonding layer DBL away from the support substrate SS. Optionally, the bonding pad BP is limited in the display-bonding sub-area DBA.

Figure 9C:
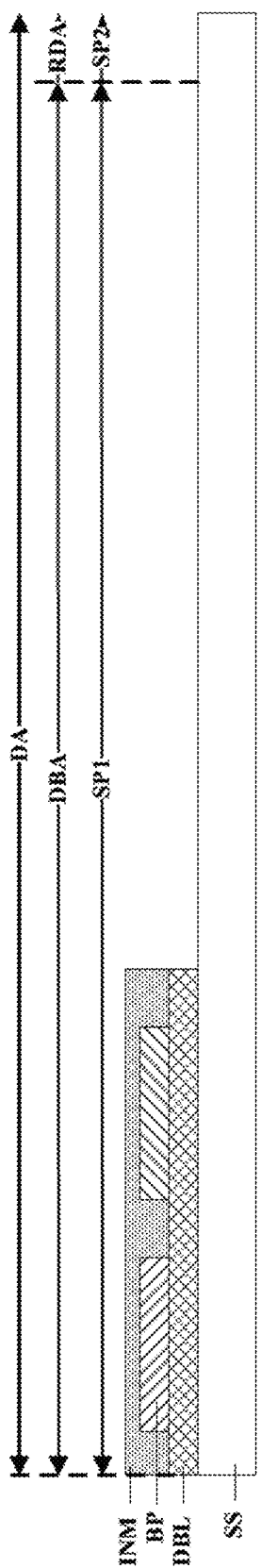

Referring to FIG. 9C, the method further includes forming an insulating material layer INM limited in the display-bonding sub-area DBA. Optionally, the insulating material layer INM is formed to extend throughout the region corresponding to the bonding pad BP. Optionally, the insulating material layer INM is formed on a side of the debonding layer DBL and the bonding pad BP away from the supporting substrate SS. Optionally, the insulating material layer INM is formed to cover the bonding pad BP.

Figure 9D:
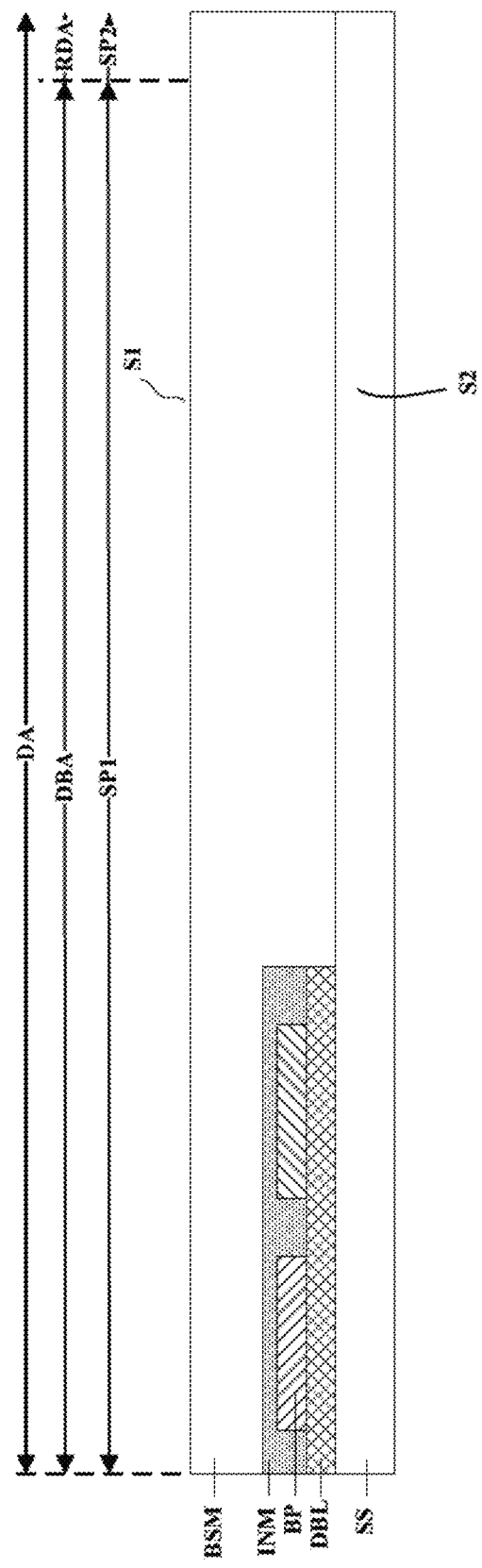

Referring to FIG. 9D, the method further includes forming a base substrate material layer BSM throughout the regular display sub-area RDA and the display-bonding sub-area DBA, and on a side of the insulating material layer INM away from the support substrate SS. For example, the base substrate material layer BSM is formed to cover the insulating material layer INM. Optionally, the base substrate material layer BSM is formed to have a first side S1 away from the supporting substrate SS and a second side S2 opposite to the first side S1.

Figure 9E:
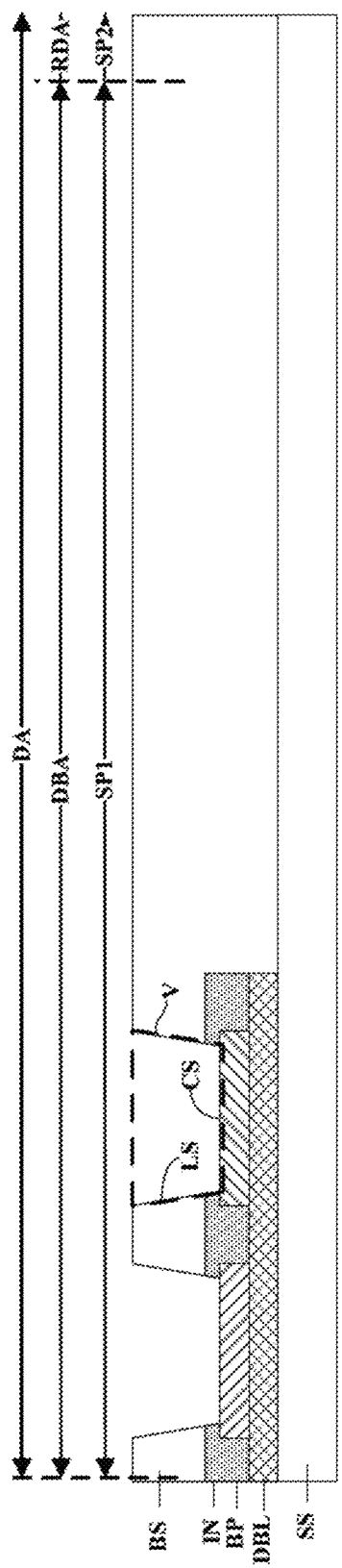

Referring to FIG. 9D and FIG. 9E, the method further includes etching the insulating material layer INM and the base substrate material layer BSM to form the via V extending through the insulating material layer INM and the base substrate material layer BSM to expose a contacting surface CS of the bonding pad BP, thereby forming an insulating layer IN limited in the display-bonding sub-area DBA, and the base substrate BS on a side of the insulating layer IN away from the supporting substrate SS.

Figure 9F:
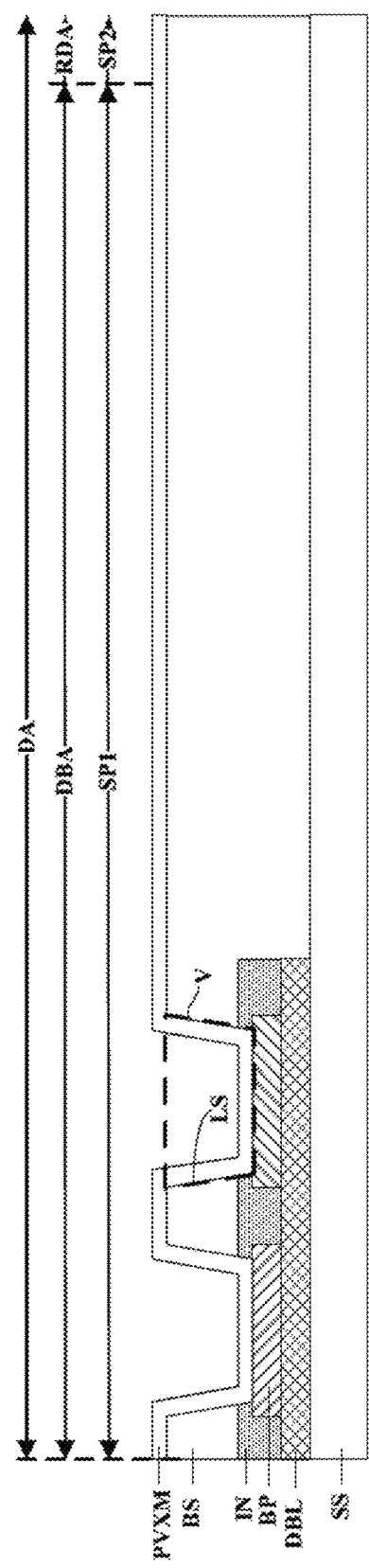

Referring to FIG. 9F, the method further includes forming a passivation material layer PVXM throughout the regular display sub-area RDA and the display-bonding sub-area DBA, and on a side of the base substrate BS away from the support substrate SS. Optionally, a portion of the passivation material layer PVXM is in direct contact with the contacting surface CS of the bonding pad BP.

Figure 9G:
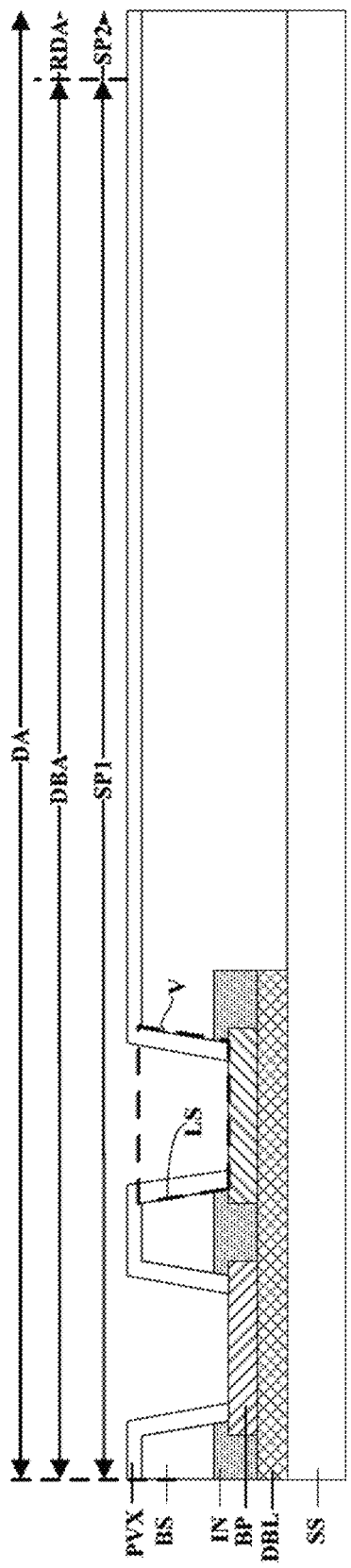

Referring to FIG. 9F and FIG. 9G, the method further includes etching the passivation material layer PVXM to expose the contacting surface CS of the bonding pad BP, thereby forming a passivation layer PVX. Optionally, the portion of the passivation material layer PVXM in direct contact with the contacting surface CS of the bonding pad BP is at least partially removed to exposed at least a portion of the contacting surface CS of the bonding pad BP. Optionally, the passivation layer PVX is formed on the first side S1 of the base substrate BS, and at least partially covering a lateral side LS of the via.

Figure 9H:
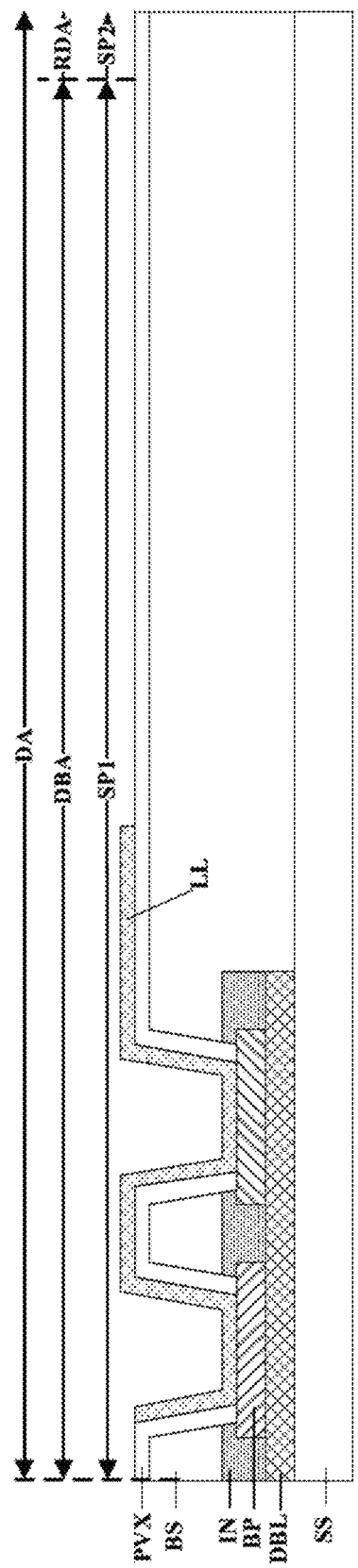

Referring to FIG. 9H, the method further includes forming the lead line LL of a side of the passivation layer PVX away from the base substrate BS. Optionally, the lead line LL is formed to extend into the via V to connect to the bonding pad BP. For example, the lead line LL is electrically connected to at least a portion of the contacting surface CS of the bonding pad BP. Optionally, the lead line LL is formed to extends from a first side S1 to the second side S2 of the base substrate BS through the via V.

Optionally, the lead line LL is limited in the display-bonding sub-area DBA. In another example, the lead line LL extends through the display-bonding sub-area DBA and the regular display sub-area RDA.

Referring to FIG. 9I, the method further includes forming a barrier layer BL throughout the regular display sub-area RDA and the display-bonding sub-area DBA, and on a side of the passivation layer PVX and the lead line LL away from the base substrate BS.

Referring to FIG. 9J, the method further includes forming a buffer layer BUF throughout the regular display sub-area RSA and the display-bonding sub-area DBA, and on a side of the barrier layer BL away from the base substrate BS.

Figure 9K:
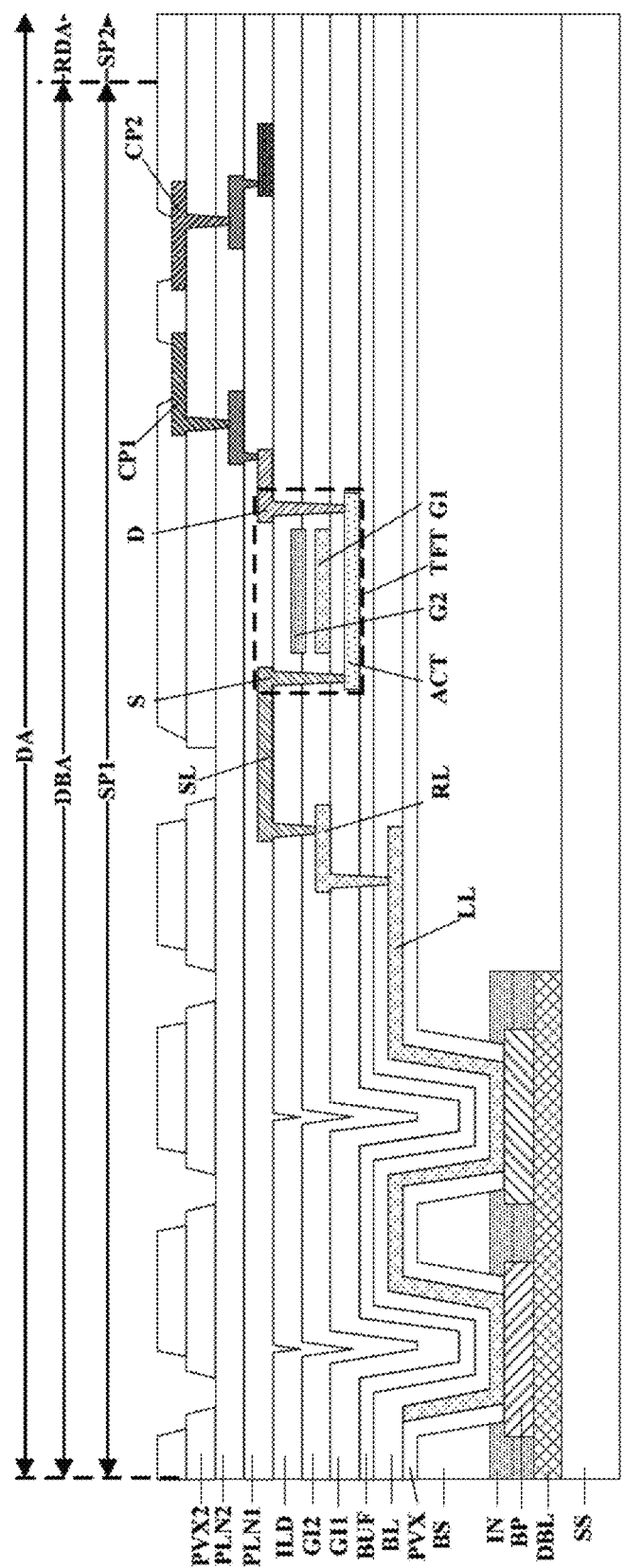

Referring to FIG. 9K, the method further includes forming an active layer ACT on a side of the buffer layer BUF away from the base substrate BS.

Optionally, the method further includes forming a first gate insulating layer GI1 on a side of the buffer layer BUF and the active layer ACT away from the barrier layer BL.

Optionally, the method further includes forming a first gate electrode G1 on aside of the first gate insulating layer GI away from the active layer ACT.

Optionally, the method further includes forming a relay line RL on a side of the first gate insulating layer GI1 away from the buffer layer BUF. In one example, the relay line RL is limited in the display-bonding sub-area DBA. In another example, the relay line RL extends through the display-bonding sub-area DBA and the regular display sub-area RDA. Optionally, the relay line RL extends through the first gate insulating layer GI1, the buffer layer BUF, and the barrier layer BL to connect with lead line LL.

Optionally, the method further includes forming a second gate insulating layer GI2 on a side of the first gate insulating layer GI1 and the first gate electrode GI away from the first gate insulating layer GI1.

Optionally, the method further includes forming a second gate electrode G2 on a side of the second gate insulating layer GI2.

Optionally, the method further includes forming an interlayer-dielectric layer ILD on a side of the second gate electrode G2 and the second gate insulating layer GI2 away from the first gate insulating layer GI1.

Optionally, the method further includes forming a signal line SL, a source electrode S, and a drain electrode D on a side of the interlayer-dielectric layer ILD away from the second gate insulating layer GI2. Optionally, the drain electrode D extends through the interlayer-dielectric layer ILD, the second gate insulating layer GI2, and the first gate insulating layer GI1 to be electrically connected to the active layer ACT. Optionally, the source electrode S extends through the interlayer-dielectric layer ILD, the second gate insulating layer GI2 and the first gate insulating layer GI1 to be electrically connected to the active layer ACT.

In one example, the source electrode S is electrically connected to the signal line SL. The signal line SL extends through the interlayer-dielectric layer ILD, and the second gate insulating layer GI2 to electrically connect to the relay line RL, therefore, the lead line LL is electrically connected to the respective one of the plurality of thin film transistors TFT.

In another example, the array substrate is absent of the relay line RL. The signal line SL extends through the interlayer-dielectric layer ILD, the second gate insulating layer GI2, the first gate insulating layer GI1, the buffer layer BUF, and the barrier layer BL to connect with lead line LL, therefore, the lead line LL is electrically connected to a respective one of the plurality of thin film transistors TFT.

In another example, an end of the source electrode S not connected with the active layer ACT extends through the interlayer-dielectric layer ILD, the second gate insulating layer GI2, the first gate insulating layer GI1, the buffer layer BUF, and the barrier layer BL to connect with lead line LL, therefore, the lead line LL is electrically connected to a respective one of the plurality of thin film transistors TFT.

Optionally, the method further includes forming a first planarization layer PLN1 on a side of the interlayer-dielectric layer ILD away from the second gate insulating layer GI2; and forming a second planarization layer PLN2 on a side of the first planarization layer PLN1 away from the interlayer-dielectric layer ILD; and forming a second passivation layer PVX2 on a side of the second planarization layer PLN2 away from the first planarization layer PLN1.

Optionally, the method further includes forming a first contacting pad CP1 and ta second contacting pad CP2 on a side of the second passivation layer PVX2 away from the second planarization layer PLN2. For example, the first contacting pad CP1 and the second contacting pad CP2 are configured to be connected with a light emitting element.

Figure 9L:
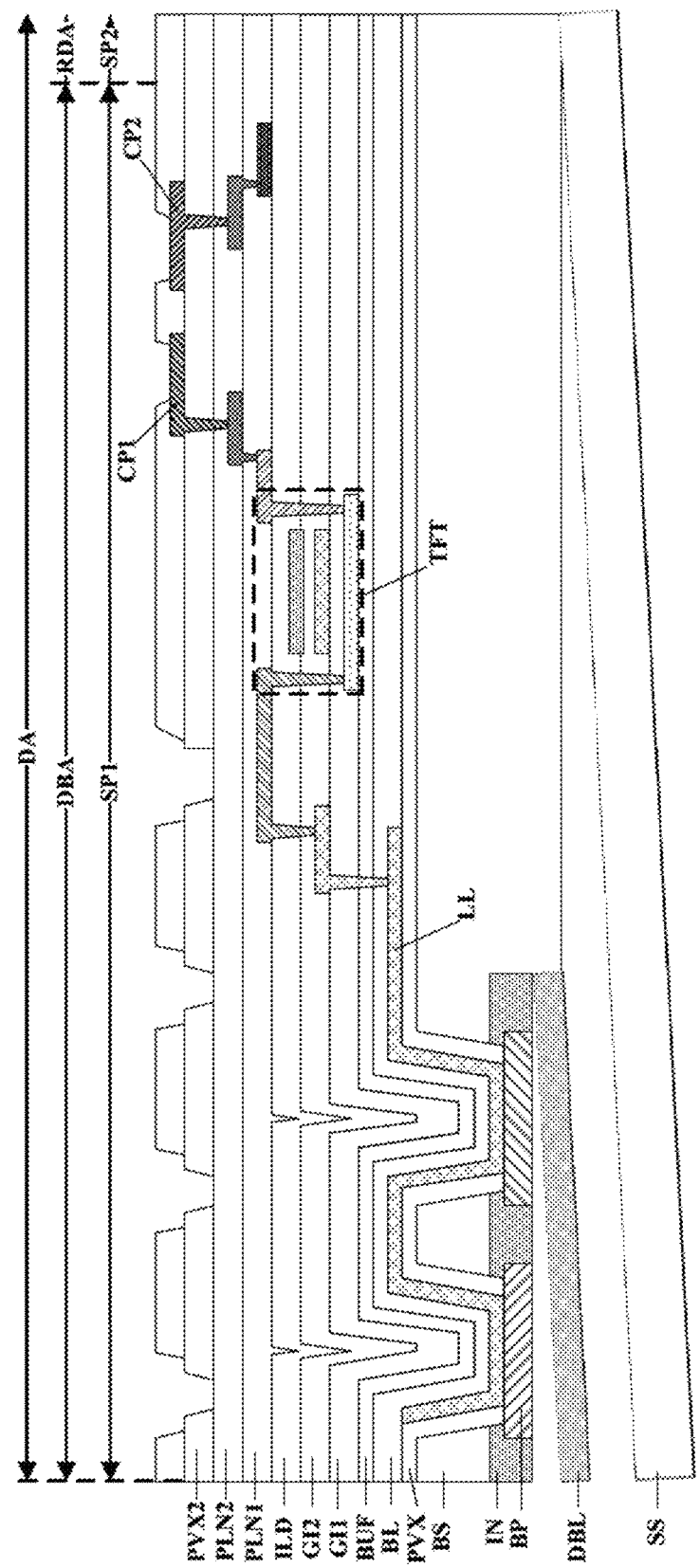

Referring to FIG. 9L, the method further includes separating the supporting substrate SS from the debonding layer DBL and the base substrate BS. For example, a laser-lift-off process can be used to separate the supporting substrate SS from the debonding layer DBL and the base substrate BS.

Figure 9M:
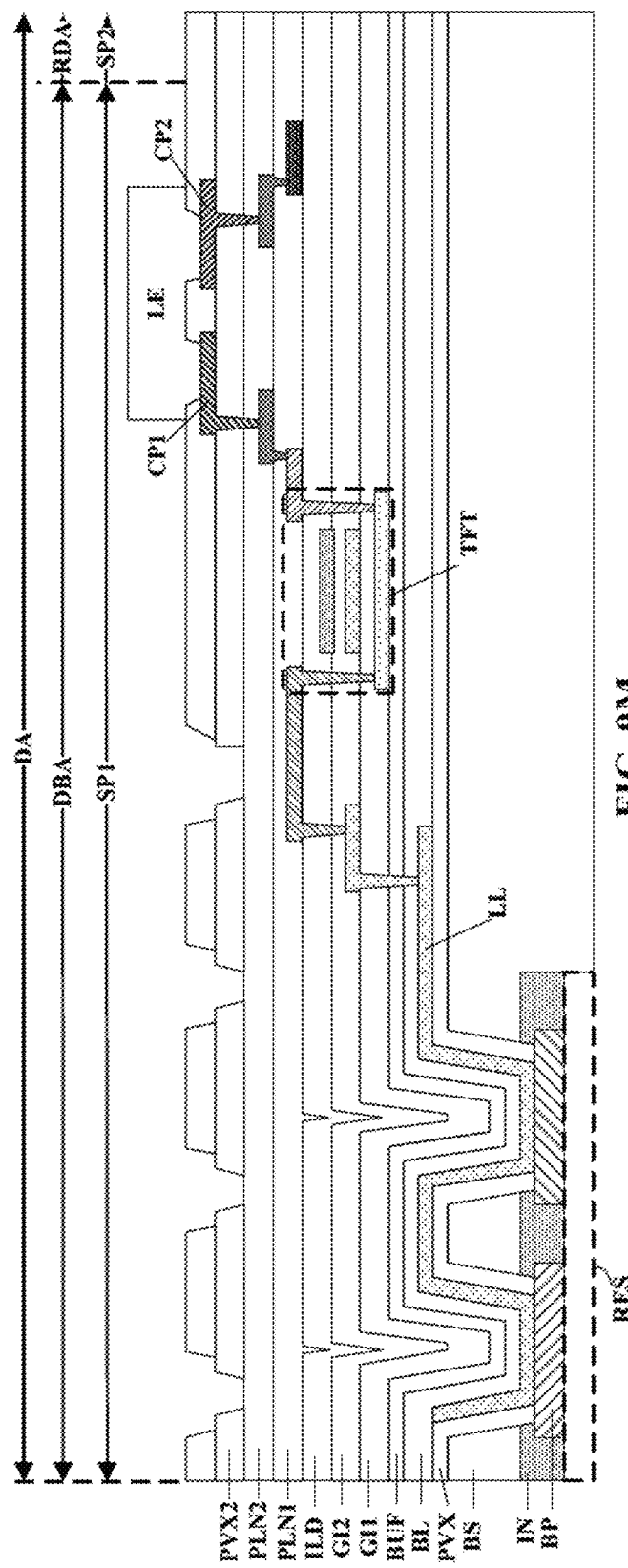

Referring to FIG. 9L and FIG. 9M, the method further includes separating the debonding layer DBL from the bonding pad BP and the insulating layer IN, thereby forming a recess RES in a region corresponding to the bonding pad BP. Optionally, the recess is formed on the second side S2 of the base substrate BS, exposing a surface of the bonding pad BP. Optionally, a laser-lift-off process can be used to separate the debonding layer DBL from the insulating layer IN.

Referring to FIG. 9M, the method further includes forming a plurality of light emitting elements LE respectively in the plurality of subpixels including the plurality of first subpixels SP1 and the plurality of second subpixels SP2. Optionally, the plurality of thin film transistors TFT are formed respectively in the plurality of subpixels.

Figure 10A:
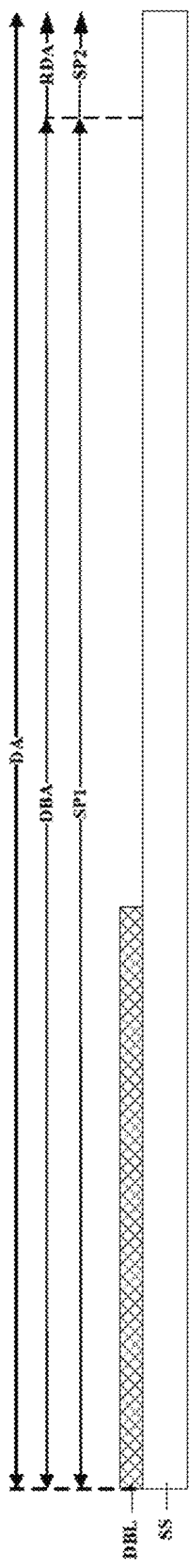
FIG. 10A to FIG. 10Q are schematic diagram illustrating a method of fabricating an array substrate in some embodiments according to the present disclosure.
Figure 10B:
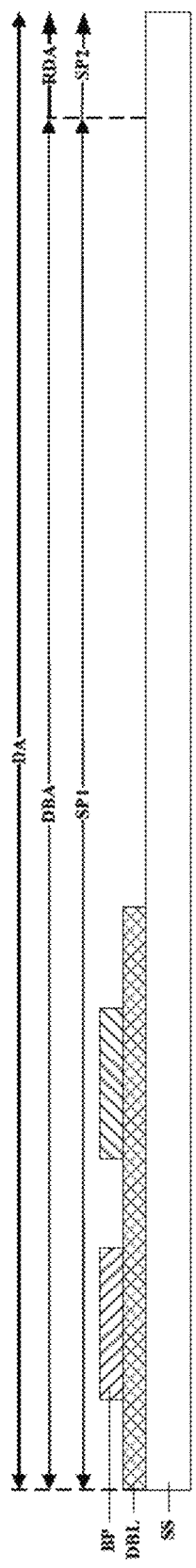
Figure 10C:
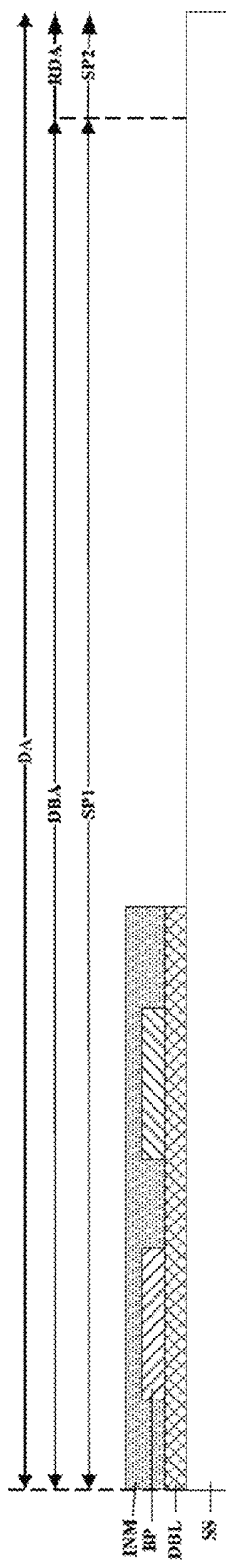
Figure 10D:
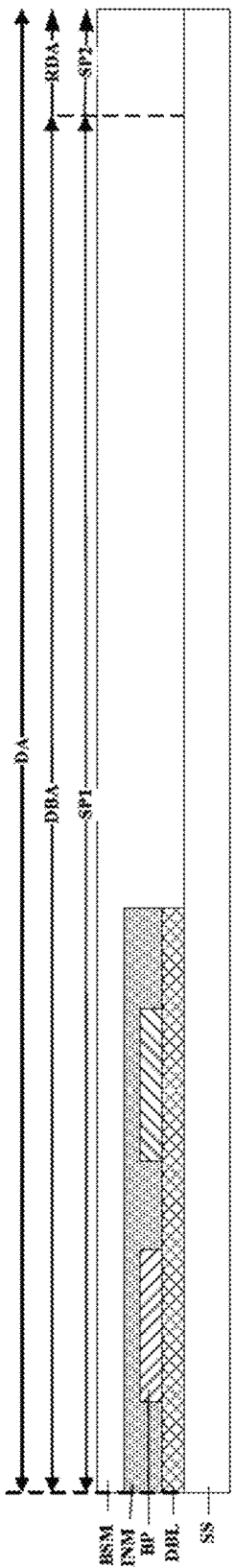
Figure 10E:
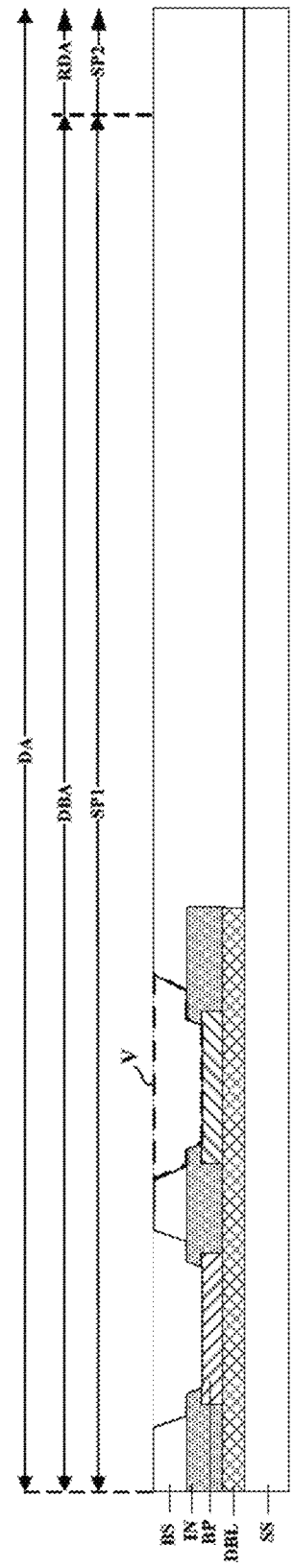
Figure 10F:
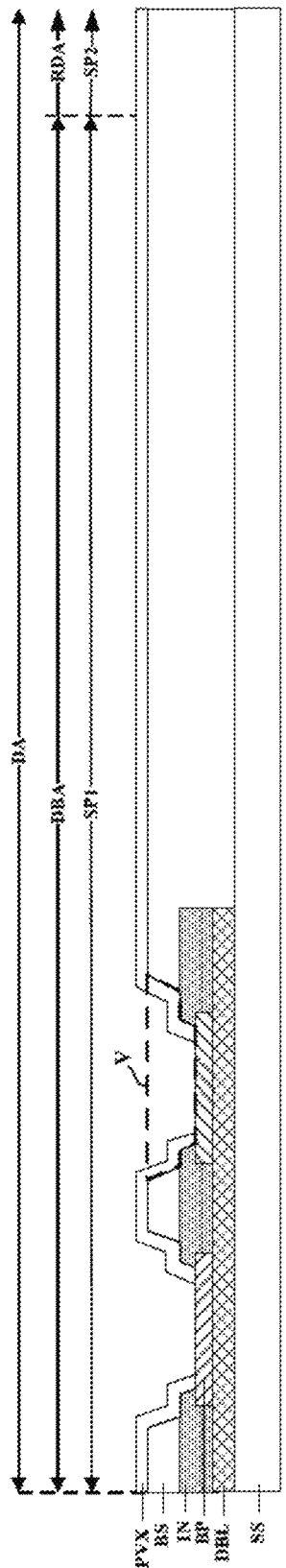
Figure 10G:
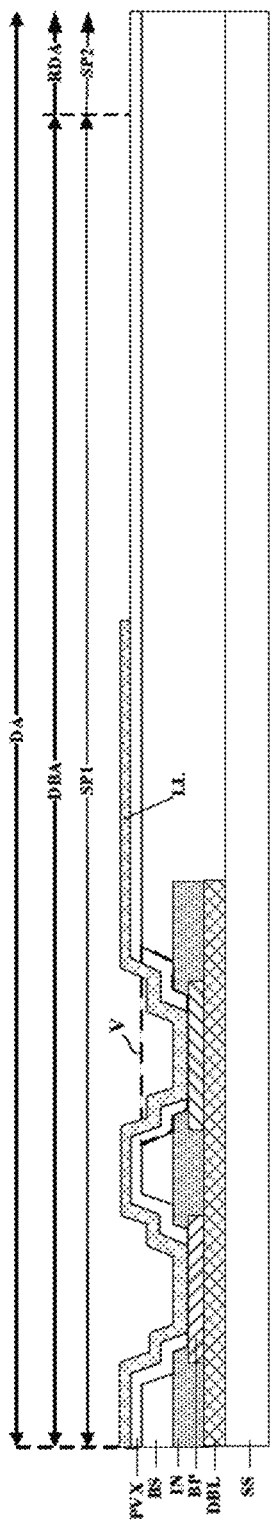

FIG. 10A to FIG. 10Q are schematic diagram illustrating a method of fabricating an array substrate in some embodiments according to the present disclosure. The fabricating steps depicted in FIG. 10A to FIG. 10G are largely similar to those depicted in FIG. 9A to FIG. 9H.

Figure 10H:
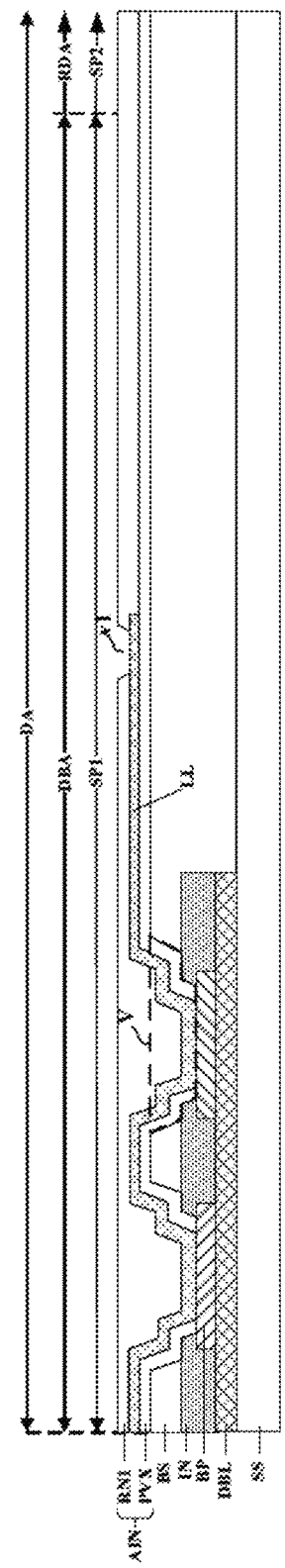

Referring to FIG. 10H, the method further includes forming a first resin layer RN1 throughout the regular display sub-area RDA and the display-bonding sub-area DBA, and on a side of the passivation layer PVX and the lead line LL away from the base substrate BS. The first resin layer RN1 is patterned to have a first via v1 exposing a surface of the lead line LL.

Figure 10I:
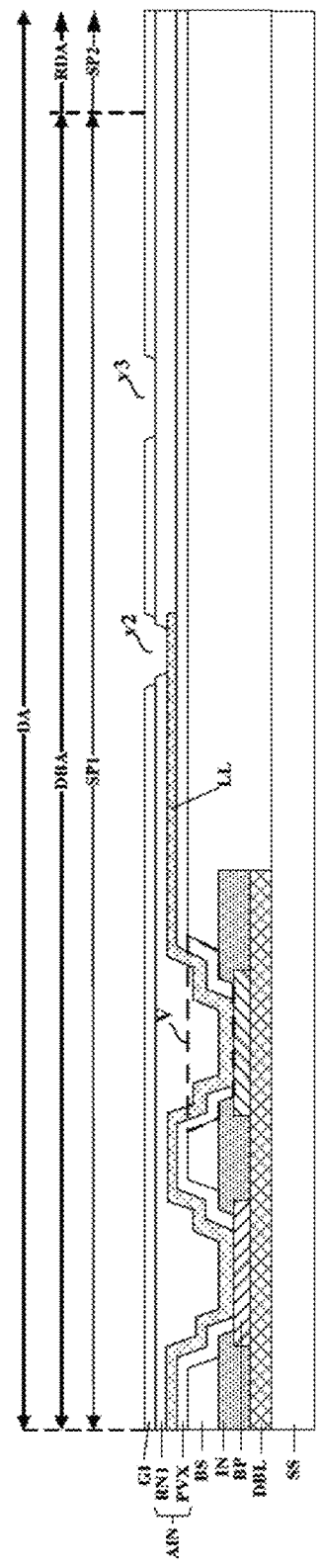

Referring to FIG. 10I, the method further includes forming a gate insulating layer GI throughout the regular display sub-area RSA and the display-bonding sub-area DBA, and on a side of the first resin layer RN1 away from the base substrate BS. The gate insulating layer GI is patterned so that a second via v2 is formed extending through the gate insulating layer GI and the first resin layer RN1, exposing a surface of the lead line LL. The gate insulating layer GI is patterned to further have a third via v3 for releasing gas produced during subsequent patterning step(s).

Figure 10J:
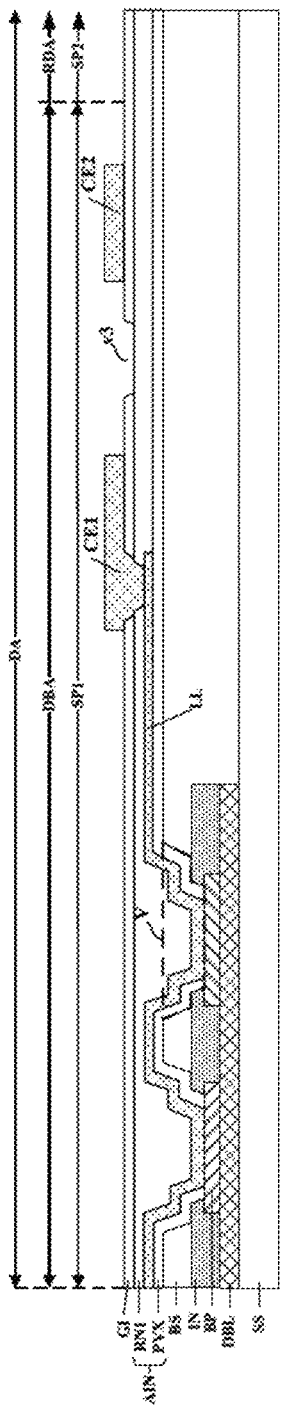

Referring to FIG. 10J, a gate metal layer is formed on a side of the gate insulating layer GI away from the base substrate BS. The gate metal layer is patterned to form various electrodes and signal lines including, for example, gate electrodes of a plurality of thin film transistors, and a first electrode CE1 and a second electrode CE2. The first electrode CE1 is electrically connected to the lead line LL, e.g., through the second via v2 as shown in FIG. 10J.

Figure 10K:
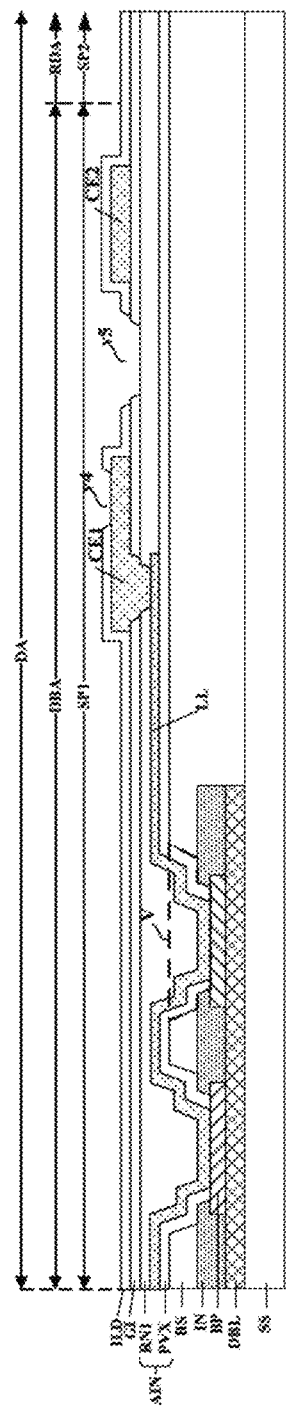

Referring to FIG. 10K, the method further includes forming an interlayer-dielectric layer ILD on a side of the gate insulating layer GI, the first electrode CE1, and the second electrode CE2 away from the first resin layer RN1. The interlayer-dielectric layer ILD is patterned to have a fourth via v4 exposing a surface of the first electrode CE1. Further, the interlayer-dielectric layer ILD is patterned so that a fifth via v5 is formed extending through the interlayer-dielectric layer ILD and the gate insulating layer for releasing gas produced during subsequent patterning step(s).

Figure 10L:
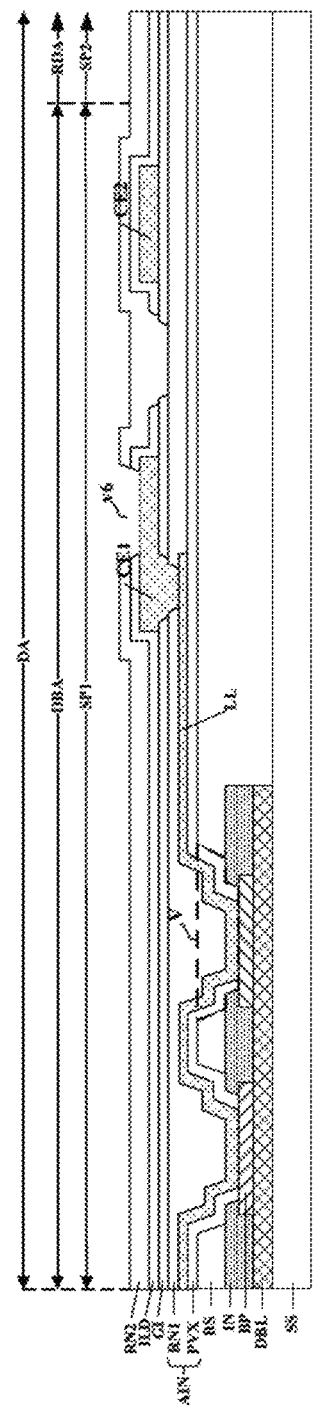

Referring to FIG. 10L, the method further includes forming a second resin layer RN2 on aside of the interlayer-dielectric layer ILD away from the gate insulating layer GI, to planarize the surface of the array substrate. The second resin layer RN2 is patterned so that a sixth via v6 is formed extending through the second resin layer RN2 and the interlayer-dielectric layer ILD to expose a surface of the first electrode CE1.

Figure 10M:
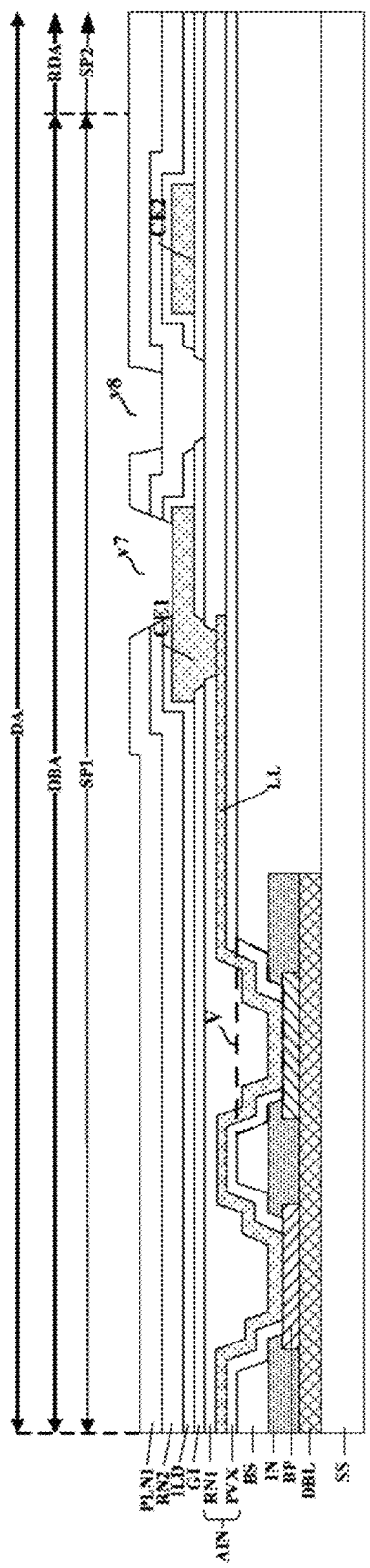

Referring to FIG. 10M the method further includes forming a first planarization layer PLN1 on a side of the second resin layer RN2 away from the interlayer-dielectric layer ILD. The first planarization layer PLN1 is patterned so that a seventh via v7 is formed extending through the first planarization layer PLN1, the second resin layer RN2, and the interlayer-dielectric layer ILD to expose a surface of the first electrode CE1. Further, the first planarization layer PLN1 is patterned to have a eighth via v8 for releasing gas produced during subsequent patterning step(s).

Figure 10N:
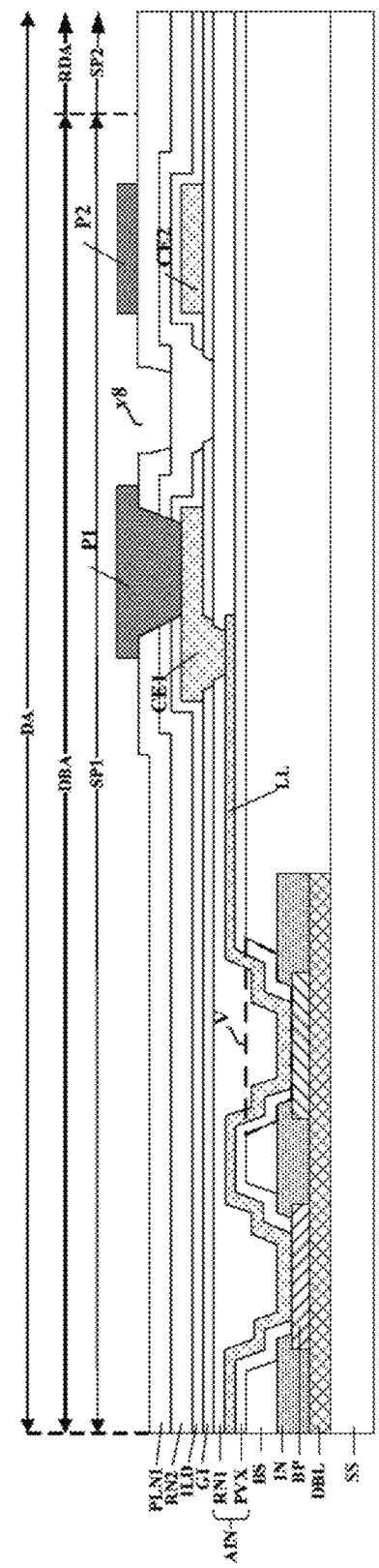
Figure 18O:
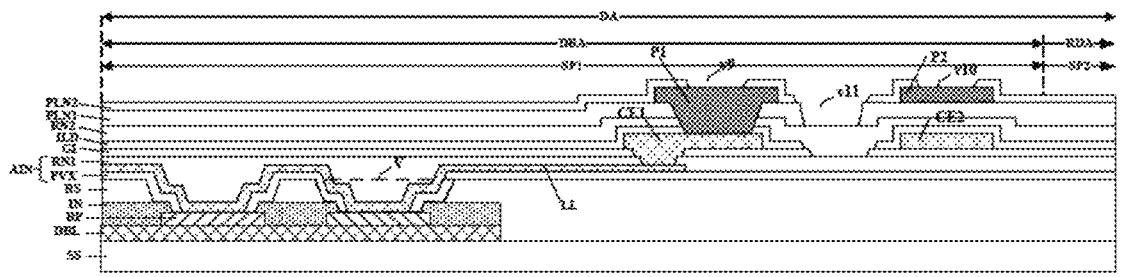
Figure 18P:
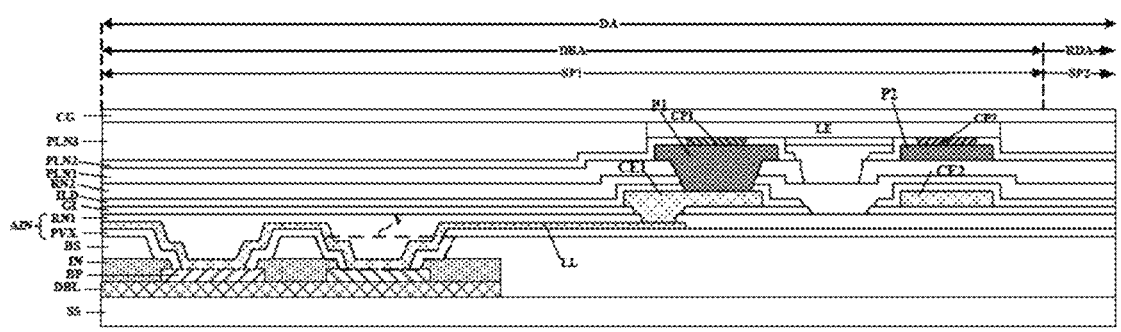
Figure 18Q:
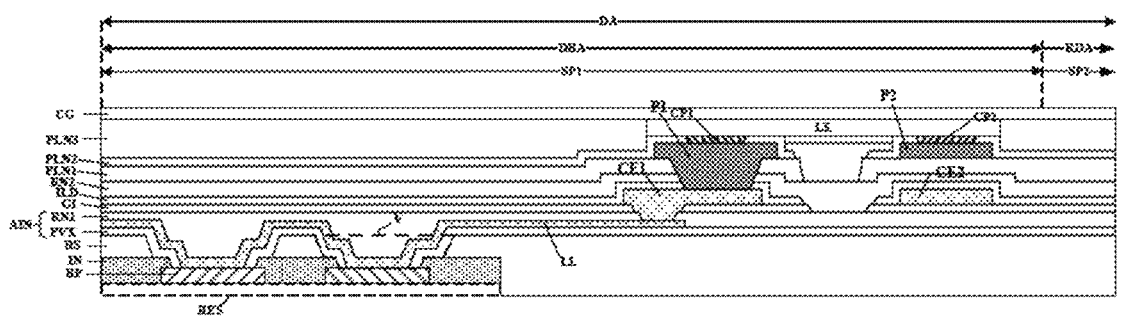

Referring to FIG. 10N, a source-drain metal layer is formed on a side of the first planarization layer PLN1 away from the base substrate BS. The source-drain metal layer is patterned to form various electrodes and signal lines including, for example, source electrodes and drain electrodes of a plurality of thin film transistors, and a first pad P1 and a second pad P2. The first pad P1 is electrically connected to the first electrode CE1, e.g., through the seventh via v7 as shown in FIG. 10N.

Referring to FIG. 10O, the method further includes forming a second planarization layer PLN2 on a side of the first planarization layer PLN1, the first pad P1, and the second pad P2 away from the second resin layer RN2. The second planarization layer PLN2 is patterned to have a ninth via v9 exposing a surface of the first pad P1 and a tenth via v10 exposing a surface of the second pad P2. Further, the second planarization layer PLN2 is patterned so that an eleventh via v11 is formed extending through the second planarization layer PLN2 and the first planarization layer PLN1 for releasing gas produced during subsequent patterning step(s).

Referring to FIG. 10P, the method further includes transferring a plurality of light emitting elements LE onto the array substrate. A respective one of the plurality of light emitting elements LE is connected to the first pad P1 through a first connecting pad CP1, and connected to the second pad P2 through a second connecting pad CP2. The method further includes forming a cover glass CG to protect the plurality of light emitting elements LE.

Referring to FIG. 10Q the method further includes separating the supporting substrate SS from the debonding layer DBL and the base substrate BS. For example, a laser-lift-off process can be used to separate the supporting substrate SS from the debonding layer DBL and the base substrate BS. By separating the debonding layer DBL from the bonding pad BP and the insulating layer IN, a recess RES is formed in a region corresponding to the bonding pad BP. Optionally, the recess is formed on the second side S2 of the base substrate BS, exposing a surface of the bonding pad BP. Optionally, a laser-lift-off process can be used to separate the debonding layer DBL from the insulating layer IN.

In another aspect, the present disclosure provides a display apparatus. In some embodiments, the display apparatus includes the array substrate described herein, and one or more integrated circuits connected to the array substrate. FIG. 11 is a cross-sectional view of a display apparatus in some embodiments according to the present disclosure. FIG. 12 is a cross-sectional view of a display apparatus in some embodiments according to the present disclosure. As shown in FIG. 11 and FIG. 12, the display apparatus includes an integrated circuit IC in the recess RES. Optionally, the integrated circuit IC connects to the surface of the bonding pad BP exposed in the recess RES. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a display area having a plurality of subpixels;

wherein the display area comprises a regular display sub-area and a display-bonding sub-area;

the plurality of subpixels comprises a plurality of first subpixels in the display-bonding sub-area and a plurality of second subpixels in the regular display sub-area;

wherein the array substrate comprises:

a base substrate extending throughout the regular display sub-area and the display-bonding sub-area; and a plurality of thin film transistors on a first side of the base substrate and respectively in the plurality of subpixels;

wherein a respective one of the plurality of first subpixels comprises:

a bonding pad on a second side of the base substrate, wherein the second side is opposite to the first side;

a lead line electrically connecting a respective one of the plurality of thin film transistors to the bonding pad, wherein the lead line is unexposed in the array substrate; and a via extending through the base substrate;

wherein the lead line extends from the first side to the second side of the base substrate through the via, to connect to the bonding pad.

2. The array substrate of claim 1, further comprising an insulating layer on the second side of the base substrate and limited in the display-bonding sub-area;

wherein the bonding pad is on a side of the insulating layer away from the base substrate; and the via extends through the base substrate and the insulating layer.

3. The array substrate of claim 2, wherein the base substrate has a first thickness t1 in a region corresponding to the bonding pad, and has a second thickness t2 in a region outside the region corresponding to the bonding pad;
the insulating layer has a third thickness t3; and $t2>(t1+t3)$.

4. The array substrate of claim 1, further comprising a recess in a region corresponding to the bonding pad for bonding the bonding pad with an integrated circuit;
wherein the recess is on the second side of the base substrate, exposing a surface of the bonding pad.

5. The array substrate of claim 4, further comprising an insulating layer on the second side of the base substrate and limited in the display-bonding sub-area;
wherein the bonding pad is on a side of the insulating layer away from the base substrate;
the via extends through the base substrate and the insulating layer; and
the recess exposes the surface of the bonding pad and a surface of the insulating layer.

6. The array substrate of claim 5, wherein the base substrate has a first thickness t1 in a region corresponding to the bonding pad, and has a second thickness t2 in a region outside the region corresponding to the bonding pad;
the insulating layer has a third thickness t3;
the recess has a fourth thickness t4; and
t2 is substantially equal to a sum of t1, t3, and t4.

7. The array substrate of claim 2, further comprising a plurality of additional insulating layers, each of which partially extending into the via.

8. The array substrate of claim 7, wherein the plurality of additional insulating layers comprise a passivation layer extending throughout the display area;
wherein the passivation layer is on the first side of the base substrate, and at least partially covering a lateral side of the via; and
the lead line is on a side of the passivation layer away from the insulating layer.

9. The array substrate of claim 8, wherein the plurality of additional insulating layers comprise further comprises a barrier layer extending throughout the display area;
wherein the barrier layer is on a side of the passivation layer and the lead line away from the base substrate; and
the insulating layer, the bonding pad, the passivation layer, and the barrier layer encapsulate the lead line inside the array substrate.

10. The array substrate of claim 9, wherein the plurality of additional insulating layers comprise further comprises a buffer layer extending throughout the display area;
wherein the respective one of the plurality of thin film transistors comprises an active layer on a side of the buffer layer away from the base substrate.

11. The array substrate of claim 1, wherein the base substrate is a flexible base substrate.

12. A display apparatus, comprising the array substrate of claim 1, and one or more integrated circuits connected to the array substrate.

13. A method of fabricating an array substrate, comprising forming a display area having a plurality of subpixels;
wherein forming the display area comprises forming a regular display sub-area and forming a display-bonding sub-area;
forming the plurality of subpixels comprises forming a plurality of first subpixels in the display-bonding sub-area and forming a plurality of second subpixels in the regular display sub-area;
wherein the method comprises forming a base substrate extending throughout the regular display sub-area and the display-bonding sub-area; and
forming a plurality of thin film transistors on a first side of the base substrate and respectively in the plurality of subpixels;
wherein forming a respective one of the plurality of first subpixels comprises:
forming a bonding pad on a second side of the base substrate, wherein the second side is opposite to the first side;
forming a lead line electrically connecting a respective one of the plurality of thin film transistors to the bonding pad, wherein the lead line is unexposed in the array substrate; and
forming a via extending through the base substrate;
wherein the lead line is formed to extend from the first side to the second side of the base substrate through the via, to connect to the bonding pad.

14. The method of claim 13, further comprising:
providing a support substrate;
forming a debonding layer limited in the display-bonding sub-area, and in a region corresponding to the bonding pad;
forming the bonding pad on a side of the debonding layer away from the support substrate;
forming an insulating material layer limited in the display-bonding sub-area;
forming a base substrate material layer throughout the regular display sub-area and the display-bonding sub-area, and on a side of the insulating material layer away from the support substrate; and
etching the insulating material layer and the base substrate material layer to form the via extending through the insulating material layer and the base substrate material layer to expose a contacting surface of the bonding pad, thereby forming an insulating layer limited in the display-bonding sub-area, and the base substrate on the insulating layer.

15. The method of claim 14, further comprising forming a passivation material layer throughout the regular display sub-area and the display-bonding sub-area, and on a side of the base substrate away from the support substrate; and
etching the passivation material layer to expose the contacting surface of the bonding pad, thereby forming a passivation layer;
wherein the passivation layer is formed on the first side of the base substrate, and at least partially covering a lateral side of the via.

16. The method of claim 15, further comprising forming the lead line of a side of the passivation layer away from the base substrate;
wherein the lead line is formed to extend into the via to connect to the bonding pad.

17. The method of claim 16, further comprising forming a barrier layer throughout the regular display sub-area and the display-bonding sub-area, and on a side of the lead line away from the base substrate;
forming a buffer layer throughout the regular display sub-area and the display-bonding sub-area, and on a side of the barrier layer away from the base substrate; and forming an active layer on a side of the buffer layer away from the base substrate.

18. The method of claim 14, further comprising separating the debonding layer from the bonding pad and the insulating layer, thereby forming a recess in a region corresponding to the bonding pad;
   wherein the recess is formed on the second side of the base substrate, exposing a surface of the bonding pad.

19. The method of claim 18, further comprising providing an integrated circuit in the recess, the integrated circuit connecting to the surface of the bonding pad exposed in the recess.

20. The method of claim 13, further comprising forming a plurality of light emitting elements respectively in the plurality of subpixels including the plurality of first subpixels and the plurality of second subpixels.

\* \* \* \* \*